(12) United States Patent
Shishido

(10) Patent No.: US 8,354,724 B2
(45) Date of Patent: Jan. 15, 2013

(54) SEMICONDUCTOR DEVICE AND ELECTRONIC DEVICE

(75) Inventor: Hideaki Shishido, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 661 days.

(21) Appl. No.: 12/073,721

(22) Filed: Mar. 10, 2008

(65) Prior Publication Data

US 2008/0237665 A1 Oct. 2, 2008

(30) Foreign Application Priority Data

Mar. 26, 2007 (JP) ................................ 2007-079763

(51) Int. Cl.
*H01L 23/62* (2006.01)
(52) U.S. Cl. ................. 257/360; 257/292; 257/E33.065
(58) Field of Classification Search .................. 257/292, 257/E33.065, 360
See application file for complete search history.

(56) References Cited

U.S. PATENT DOCUMENTS

| | | | |
|---|---|---|---|
| 4,620,212 A * | 10/1986 | Ogasawara | ................. 257/538 |
| 4,686,487 A | 8/1987 | Radovsky | |
| 5,469,092 A | 11/1995 | Itakura | |
| 5,936,231 A | 8/1999 | Michiyama et al. | |
| 6,255,897 B1 | 7/2001 | Klemmer | |
| 6,287,888 B1 | 9/2001 | Sakakura et al. | |
| 6,316,971 B1 | 11/2001 | Ohashi | |
| 6,531,711 B2 | 3/2003 | Sakakura et al. | |
| 6,876,233 B1 | 4/2005 | Bernardson | |
| 6,911,358 B2 | 6/2005 | Azami et al. | |
| 6,930,326 B2 | 8/2005 | Kato et al. | |
| 7,030,551 B2 | 4/2006 | Yamazaki et al. | |
| 7,042,432 B2 | 5/2006 | Yamazaki et al. | |
| 7,158,194 B2 | 1/2007 | Lo et al. | |
| 7,183,147 B2 | 2/2007 | Murakami et al. | |

(Continued)

FOREIGN PATENT DOCUMENTS

CN 1612351 5/2005

(Continued)

OTHER PUBLICATIONS

Chinese Office Action (Application No. 200810086693.5) Dated Dec. 7, 2010.

*Primary Examiner* — Zandra Smith
*Assistant Examiner* — Jamie C Niesz
(74) *Attorney, Agent, or Firm* — Eric J. Robinson; Robinson Intellectual Property Law Office, P.C.

(57) ABSTRACT

The present invention relates to a semiconductor device which includes a photoelectric conversion layer; an amplifier circuit amplifying an output current of the photoelectric conversion layer and including two thin film transistors; a first terminal supplying a high-potential power supply voltage; a second terminal supplying a low-potential power supply voltage; an electrode electrically connecting the two thin film transistors and the photoelectric conversion layer; a first wiring electrically connecting the first terminal and a first thin film transistor which is one of the two thin film transistors; and a second wiring electrically connecting the second terminal and a second thin film transistor which is the other of the two thin film transistors. In the semiconductor device, the value of voltage drop of the first wiring and the second wiring are increased by bending the first wiring and the second wiring.

17 Claims, 19 Drawing Sheets

U.S. PATENT DOCUMENTS

| | | |
|---|---|---|
| 7,193,619 B2 | 3/2007 | Kimura |
| 7,209,208 B2 | 4/2007 | Iwabuchi |
| 7,253,391 B2 | 8/2007 | Koyama et al. |
| 7,312,473 B2 | 12/2007 | Koyama et al. |
| 7,492,028 B2 | 2/2009 | Nishi et al. |
| 7,495,272 B2 | 2/2009 | Maruyama et al. |
| 7,608,531 B2 | 10/2009 | Isa et al. |
| 7,667,272 B2 | 2/2010 | Hirose |
| 7,936,037 B2 | 5/2011 | Nishi et al. |
| 2004/0042707 A1 | 3/2004 | Imai et al. |
| 2005/0116310 A1 | 6/2005 | Nishi et al. |
| 2006/0186497 A1* | 8/2006 | Nishi et al. .................. 257/428 |
| 2007/0181875 A1 | 8/2007 | Yamazaki et al. |
| 2007/0252213 A1* | 11/2007 | Hirose .......................... 257/360 |
| 2009/0117681 A1 | 5/2009 | Maruyama et al. |
| 2009/0224237 A1 | 9/2009 | Isa et al. |
| 2010/0140456 A1 | 6/2010 | Hirose |
| 2012/0012846 A1 | 1/2012 | Isa et al. |

FOREIGN PATENT DOCUMENTS

| | | |
|---|---|---|
| JP | 58-207663 A | 12/1983 |
| JP | 06-037558 | 2/1994 |
| JP | 2005-136394 | 5/2005 |
| JP | 2006-237587 A | 9/2006 |
| JP | 2006-324634 A | 11/2006 |
| WO | WO 2005/114749 | 12/2005 |

* cited by examiner

SEMICONDUCTOR DEVICE AND ELECTRONIC DEVICE

BACKGROUND OF THE INVENTION

1. Field of the Invention

The present invention relates to a semiconductor device having a photoelectric conversion element. In particular, the present invention relates to a semiconductor device having a photoelectric conversion element formed using a thin film semiconductor element and a manufacturing method thereof. Further, the present invention relates to an electronic device using the semiconductor device having the photoelectric conversion element.

2. Description of the Related Art

A large number of photoelectric conversion devices generally used for detecting electromagnetic waves are known, and for example, photoelectric conversion devices having sensitivity to ultraviolet rays to infrared rays are referred to as optical sensors (also referred to as photo sensors). Among optical sensors, an optical sensor having sensitivity to a visible light region with a wavelength of 400 to 700 nm is particularly referred to as a visible light sensor. A large number of visible light sensors are used for devices which need illuminance adjustment, on/off control, or the like depending on human living environment.

In particular, in a display device, ambient brightness of the display device is detected to adjust display luminance. This is because unnecessary power consumption can be reduced by detecting ambient brightness and obtaining appropriate display luminance. For example, such an optical sensor for adjusting luminance is used for a mobile phone or a personal computer.

In addition, not only ambient brightness but also luminance of a display device, in particular, luminance of a backlight of a liquid crystal display device is detected by an optical sensor to adjust luminance of a display screen.

In such an optical sensor, a photodiode is used for a detecting portion and output current of the photodiode is amplified in an amplifier circuit. A current mirror circuit is used for such an amplifier circuit, for example (see Reference 1: Japanese Published Patent Application No. 2005-136394).

SUMMARY OF THE INVENTION

A current mirror circuit is formed using a transistor; however, there is a case where an electrode or a transistor is damaged by static electricity generated at the time of manufacturing a current mirror circuit or using a current mirror circuit.

When a protection circuit which is connected to an electrode is provided in order to prevent an element from being damaged by static electricity, i.e., electrostatic discharge (ESD), the size of an optical sensor increases.

It is an object of the present invention to prevent electrostatic discharge by not forming linearly but curving or bending an electrode which is formed using the same material and through the same step as a source electrode and a drain electrode and is electrically connected to a power supply electrode to increase the resistance value.

The present invention corresponds to a semiconductor device which includes a photoelectric conversion element, an amplifier circuit, and an input-output terminal. In the semiconductor device, a wiring which connects the photoelectric conversion element and the amplifier circuit and/or a wiring which connects the input-output terminal and the amplifier circuit are/is bent or curved. When the wiring is bent or curved, wiring resistance can be increased, so that electrostatic discharge can be prevented. It is also effective to thin and divide such a bent or curved wiring into a plurality of wirings.

The present invention relates to the following semiconductor devices.

The present invention relates to a semiconductor device which includes a photoelectric conversion layer; an amplifier circuit amplifying output current of the photoelectric conversion layer and including two thin film transistors; a first terminal supplying high-potential power supply voltage; a second terminal supplying low-potential power supply voltage; an electrode electrically connecting the two thin film transistors and the photoelectric conversion layer; a first wiring electrically connecting the first terminal and a first thin film transistor which is one of the two thin film transistors; and a second wiring electrically connecting the second terminal and a second thin film transistor which is the other of the two thin film transistors. In the semiconductor device, the value of voltage drop of the first wiring and the second wiring are increased by bending the first wiring and the second wiring.

The present invention relates to a semiconductor device which includes two thin film transistors over a substrate; a first interlayer insulating film having a tapered edge over the thin film transistors; a source electrode electrically connected to a source region of a first thin film transistor which is one of the thin film transistors, a drain electrode electrically connected to a drain region of the first thin film transistor, a gate wiring electrically connected to a gate electrode of the first thin film transistor, a first electrode and a second electrode to which voltage from a low-potential power source is applied, and a third electrode to which voltage from a high-potential power source is applied, over the first interlayer insulating film; a photoelectric conversion layer overlapping with the second electrode; a protective film covering the substrate, the first interlayer insulating film, the first electrode, the source electrode, the gate wiring, the drain electrode, the second electrode, the photoelectric conversion layer, and the third electrode; a second interlayer insulating film over the protective film; and a fourth electrode electrically connected to the first electrode and a fifth electrode electrically connected to an upper layer of the photoelectric conversion layer and the third electrode over the second interlayer insulating film. In the semiconductor device, the drain electrode of the first thin film transistor is electrically connected to the third electrode; the source electrode of the first thin film transistor is electrically connected to the first electrode; and the value of voltage drop of the drain electrode and the source electrode of the first thin film transistor is increased by bending the drain electrode and the source electrode of the first thin film transistor.

In the present invention, the amplifier circuit is a current mirror circuit.

When the present invention is used, electrostatic discharge can be suppressed without changing the size of an optical sensor. Thus, reliability of a semiconductor device can be improved without changing the size of the semiconductor device.

DETAILED DESCRIPTION OF THE INVENTION

Figure 1:
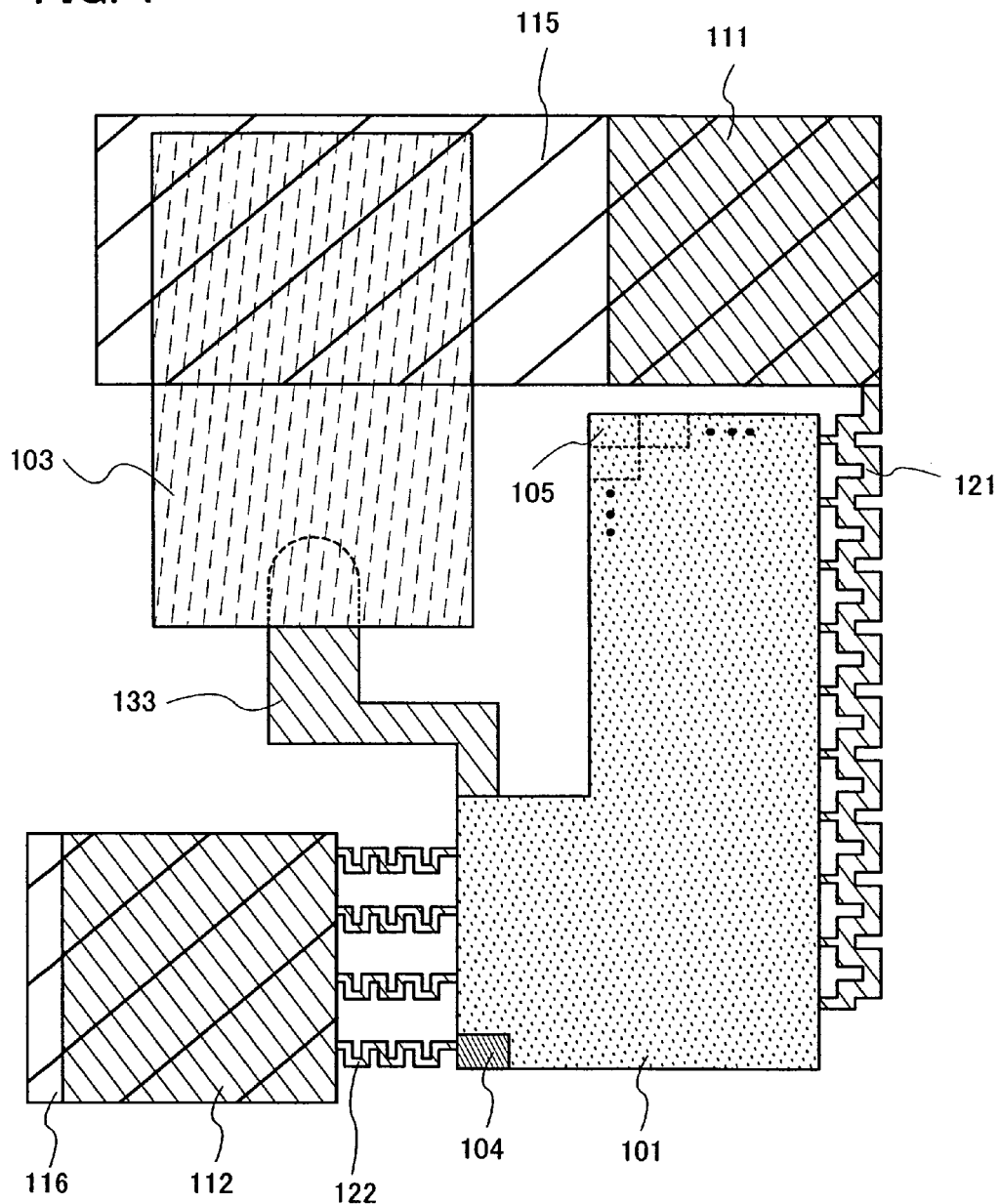
FIG. 1 is a top view of a photoelectric conversion device of the present invention.

Hereinafter, embodiment modes of the present invention will be described with reference to the drawings. Note that the present invention is not limited to the following description. The present invention can be implemented in various different ways and it will be readily appreciated by those skilled in the art that various changes and modifications are possible without departing from the spirit and the scope of the present invention. Therefore, the present invention should not be construed as being limited to the following description of the embodiment modes.

Note that in all the drawings for describing the embodiment modes, like portions or portions having similar functions are denoted by the same reference numerals, and description thereof is not repeated.

Embodiment Mode 1

A photoelectric conversion device of this embodiment mode is described below with reference to FIG. 1, FIG. 2, FIG. 3, FIG. 4, FIGS. 5A to 5C, FIGS. 6A to 6C, FIGS. 7A and 7B, FIG. 8, FIG. 9, and FIG. 10.

Figure 3:
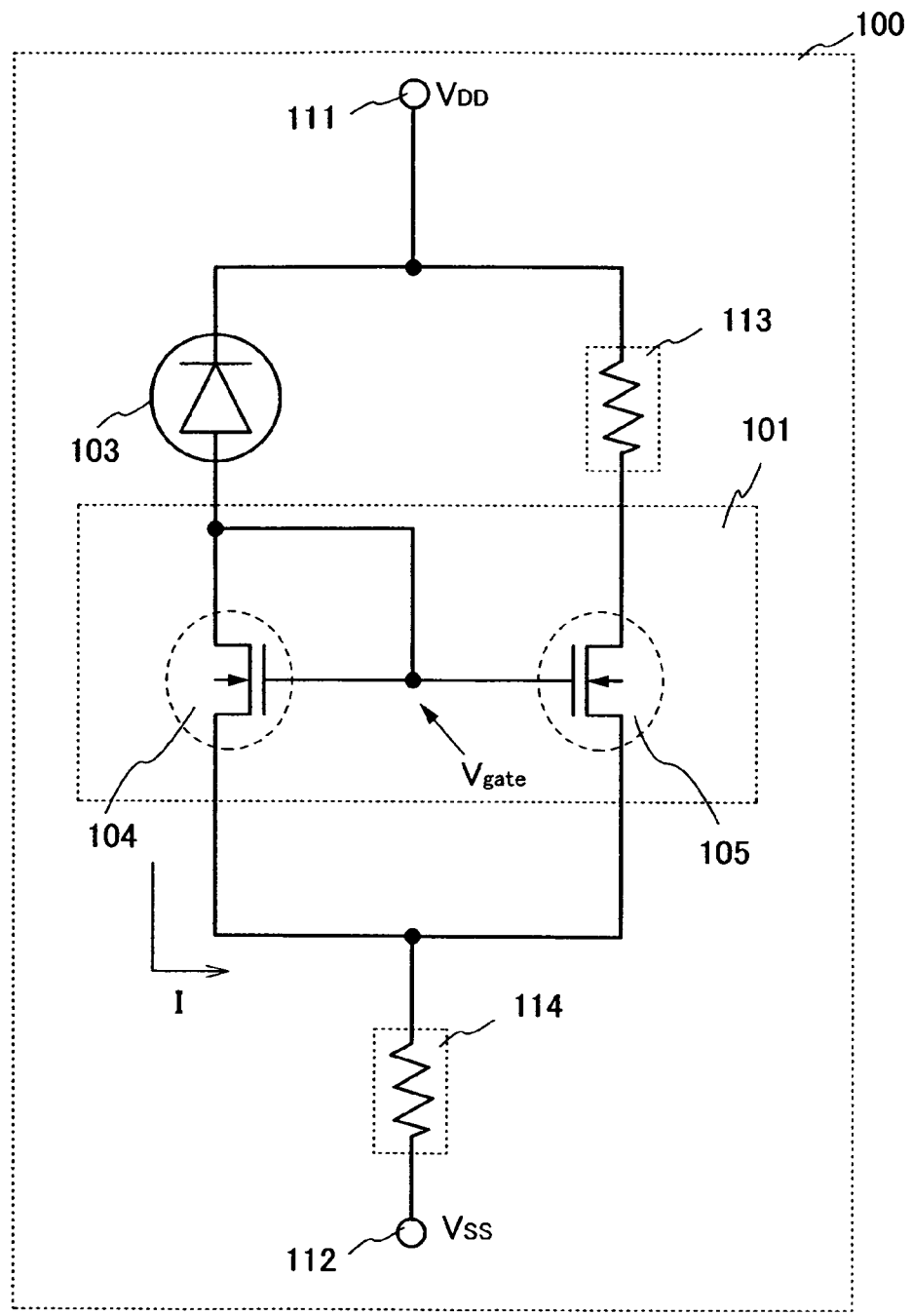
FIG. 3 is a circuit diagram of a photoelectric conversion device of the present invention.
Figure 4:
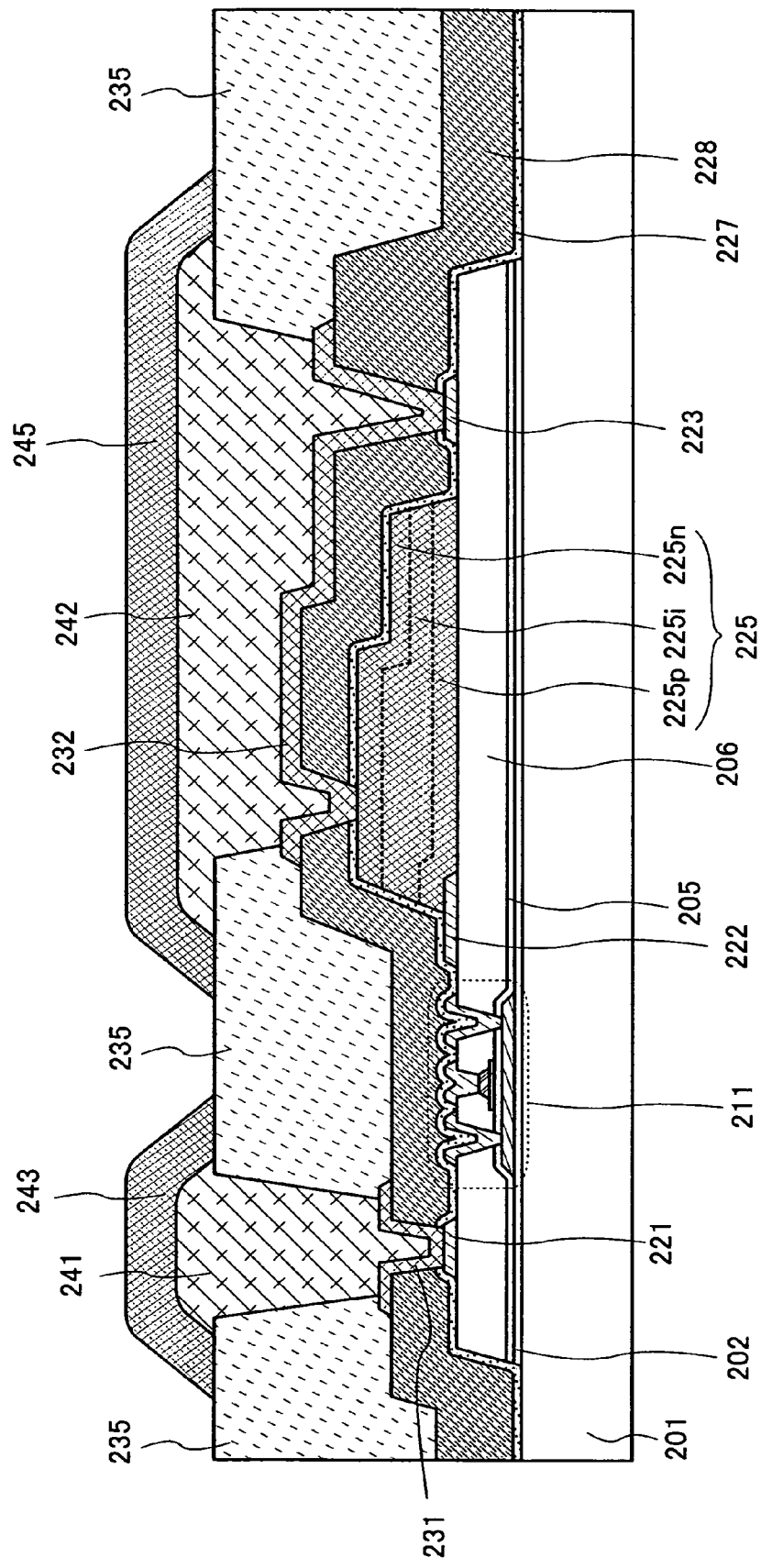
FIG. 4 is a cross-sectional view of a photoelectric conversion device of the present invention.

First, as shown in FIG. 3, a photoelectric conversion device 100 of this embodiment mode includes a photodiode 103 and a current mirror circuit 101 which is an amplifier circuit amplifying output current of the photodiode 103. The current mirror circuit 101 includes thin film transistors (TFTs) 104 and 105.

In this embodiment mode, n-channel TFTs are used as the TFTs 104 and 105. In the current mirror circuit 101, the same voltage is applied to gate portions of the reference-side TFT 104 and the output-side TFT 105 to control current flowing through the output-side TFT 105 based on current flowing through the reference-side TFT 104.

In FIG. 3, a gate electrode of the TFT 104 included in the current mirror circuit 101 is electrically connected to a gate electrode of the TFT 105 included in the current mirror circuit 101 and is also electrically connected to a drain electrode (also referred to as a drain terminal), which is one of a source electrode and a drain electrode of the TFT 104.

The drain terminal of the TFT 104 is electrically connected to a drain terminal of the TFT 105 through the photodiode 103 and a resistor 113 and a terminal 111 which supplies high-potential power supply voltage $V_{DD}$.

A source electrode (also referred to as a source terminal), which is one of the source electrode and the drain electrode of the TFT 104 is electrically connected to a source terminal of the TFT 105 and a terminal 112 which supplies low-potential power supply voltage $V_{SS}$ through a resistor 114.

In addition, the gate electrode of the TFT 105 included in the current mirror circuit 101 is electrically connected to the gate electrode and the drain terminal of the TFT 104.

The drain terminal of the TFT 105 is electrically connected to the drain terminal of the TFT 104 and the terminal 111 which supplies high-potential power supply voltage $V_{DD}$ through the resistor 113.

The source terminal of the TFT 105 is electrically connected to the source terminal of the TFT 104 and the terminal 112 which supplies low-potential power supply voltage $V_{SS}$ through the resistor 114.

Further, since the gate electrodes of the TFTs 104 and 105 are connected to each other, a common potential $V_{gate}$ is applied thereto.

The resistors 113 and 114 correspond to wiring resistance of wirings 121 and 122 which are described later, respectively. The wiring 121 is a wiring which connects the drain terminal of the TFT 105 and the terminal 111. The wiring 122 is a wiring which connects the source terminals of the TFTs 104 and 105 and the terminal 112.

FIG. 3 shows an example of a current mirror circuit using two TFTs. At this time, when the TFTs 104 and 105 have the same characteristics, the ratio between reference current and output current is 1:1.

Figure 9:
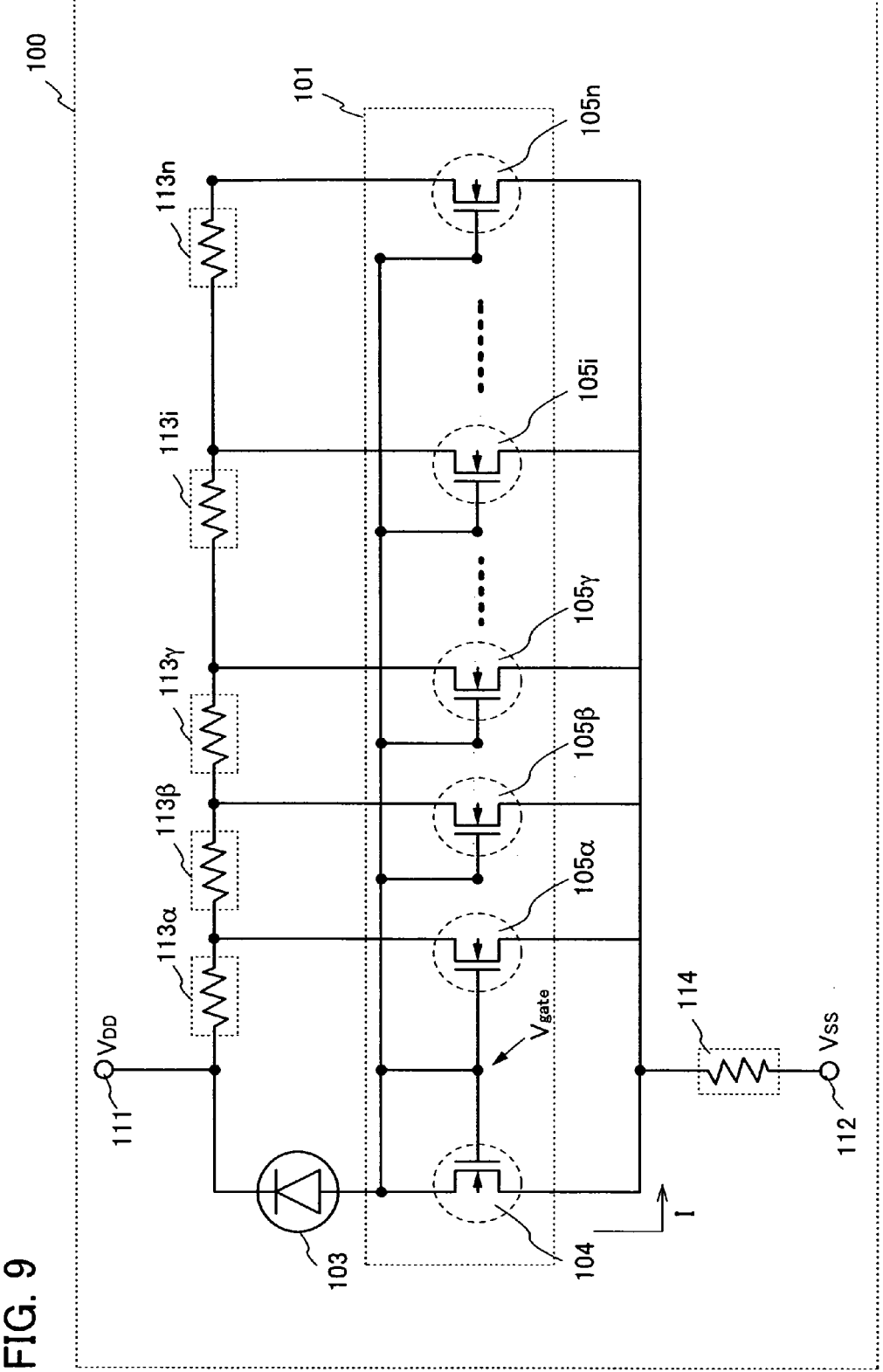
FIG. 9 is a circuit diagram of a photoelectric conversion device of the present invention.

FIG. 9 shows a circuit structure for increasing an output value n times. The circuit structure in FIG. 9 corresponds to a structure in which the number of TFTs 105 in FIG. 3 is n. When the ratio between the n-channel TFT 104 and the n-channel TFTs 105 is set at 1:n as shown in FIG. 9, the output value can be increased n times. This is based on a similar principle to increasing the channel width W of a TFT to increase the allowable amount of current that can flow through the TFT n times.

For example, when the output value is designed to be increased 100 times, one n-channel TFT 104 and 100 n-channel TFTs 105 are connected in parallel, so that desired current can be obtained.

Note that portions denoted by reference numerals with "i" in FIG. 9 are the same as those denoted by the reference numerals without "i" in FIG. 3. That is, for example, the TFT 105 in FIG. 3 and a TFT 105i in FIG. 9 are the same TFTs, and the resistor 113 in FIG. 3 and a resistor 113i in FIG. 9 are the same resistors. Further, in FIG. 9, a first TFT and a first resistor are denoted by reference numerals with "α" and a second TFT and a second resistor are denoted by reference numerals with "β" in Greek alphabetical order. Portions denoted by reference numerals with "α" and "β" are the same as those denoted by the reference numerals without "α" and "β" in FIG. 3, respectively.

Therefore, in FIG. 9, the n-channel TFT 105 is formed using n pieces of n-channel TFTs 105α, 105β, 105γ, ... 105i, ... and 105n. Thus, current flowing through the TFT 104 is amplified n times and output.

FIG. 1 is a top view of a photoelectric conversion device of this embodiment mode. The photoelectric conversion device in FIG. 1 includes the photodiode 103; the current mirror circuit 101 having the TFTs 104 and 105; the terminal 111 which supplies high-potential power supply voltage $V_{DD}$; the terminal 112 which supplies low-potential power supply voltage $V_{SS}$; a wiring 115 which electrically connects the terminal 111 and the photodiode 103 (the same as an electrode 232 described later); a wiring 116 which is electrically connected to the terminal 112 (the same as an electrode 231 described later); an electrode 133 which electrically connects the drain terminal of the TFT 104 and the photodiode 103 (the same as an electrode 222 described later); the wiring 121 which electrically connects the drain terminal of the TFT 105 and the terminal 111; and the wiring 122 which electrically connects the source terminal of the TFT 104 and the terminal 122.

When the wirings 121 and 122 are not formed linearly but formed curved or bent continuously. Specifically, when the wirings 121 and 122 are formed in a meandering shape which is curved or bent continuously in a U-shape, wave shape or another shape, the resistor 113 which corresponds to wiring resistance of the wiring 121 and the resistor 114 which corresponds to the wiring resistance of the wiring 122 (see FIGS. 3 and 9) can be increased. When the wirings 121 and 122 are curved or bent as described above, the value of voltage drop of the wirings 121 and 122 can be increased.

Accordingly, application of high potentials generated in the terminals 111 and 112 by static electricity to the TFTs 104 and 105 can be reduced.

In addition, since the wirings 121 and 122 are bent to increase wiring resistance, there are advantages in that it is not necessary to additionally provide a protection circuit and it is not necessary to increase the size of the photoelectric conversion device.

Figure 2:
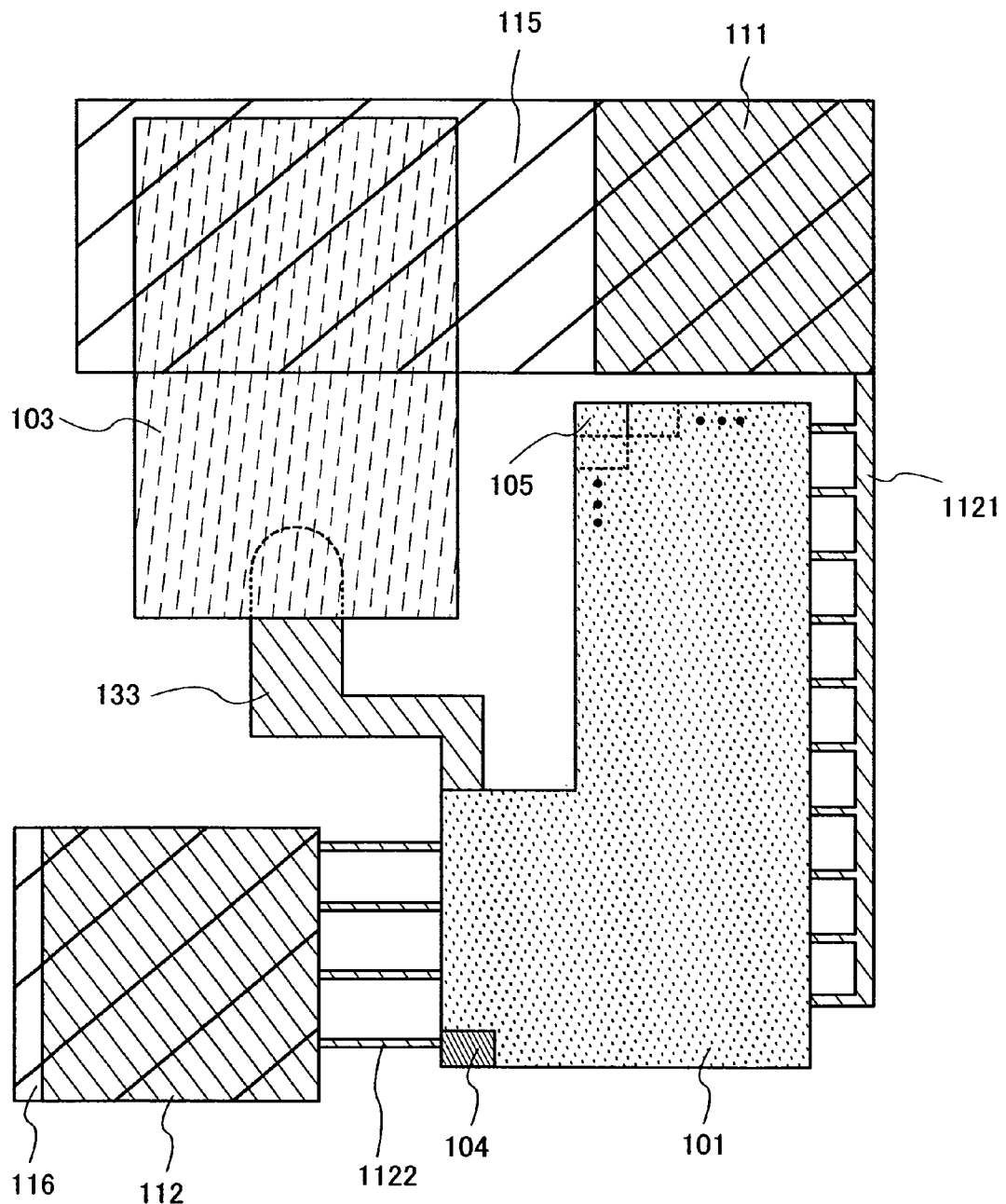
FIG. 2 is a top view of a photoelectric conversion device of the present invention.

FIG. 2 shows a photoelectric conversion device having a wiring 1121 which is not bent but formed linearly instead of the wiring 121 in FIG. 1 and a wiring 1122 which is not bent but formed linearly instead of the wiring 122 in FIG. 1.

When the wirings 1121 and 1122 are formed linearly as described above, wiring resistance cannot be increased, so that the value of voltage drop is maintained low. Therefore, even when high potentials are generated in the terminals 111 and 112 by static electricity, they cannot be reduced. Accordingly, there is a fear that a risk of electrostatic discharge of the TFTs 104 and 105 cannot be reduced.

Figure 18:
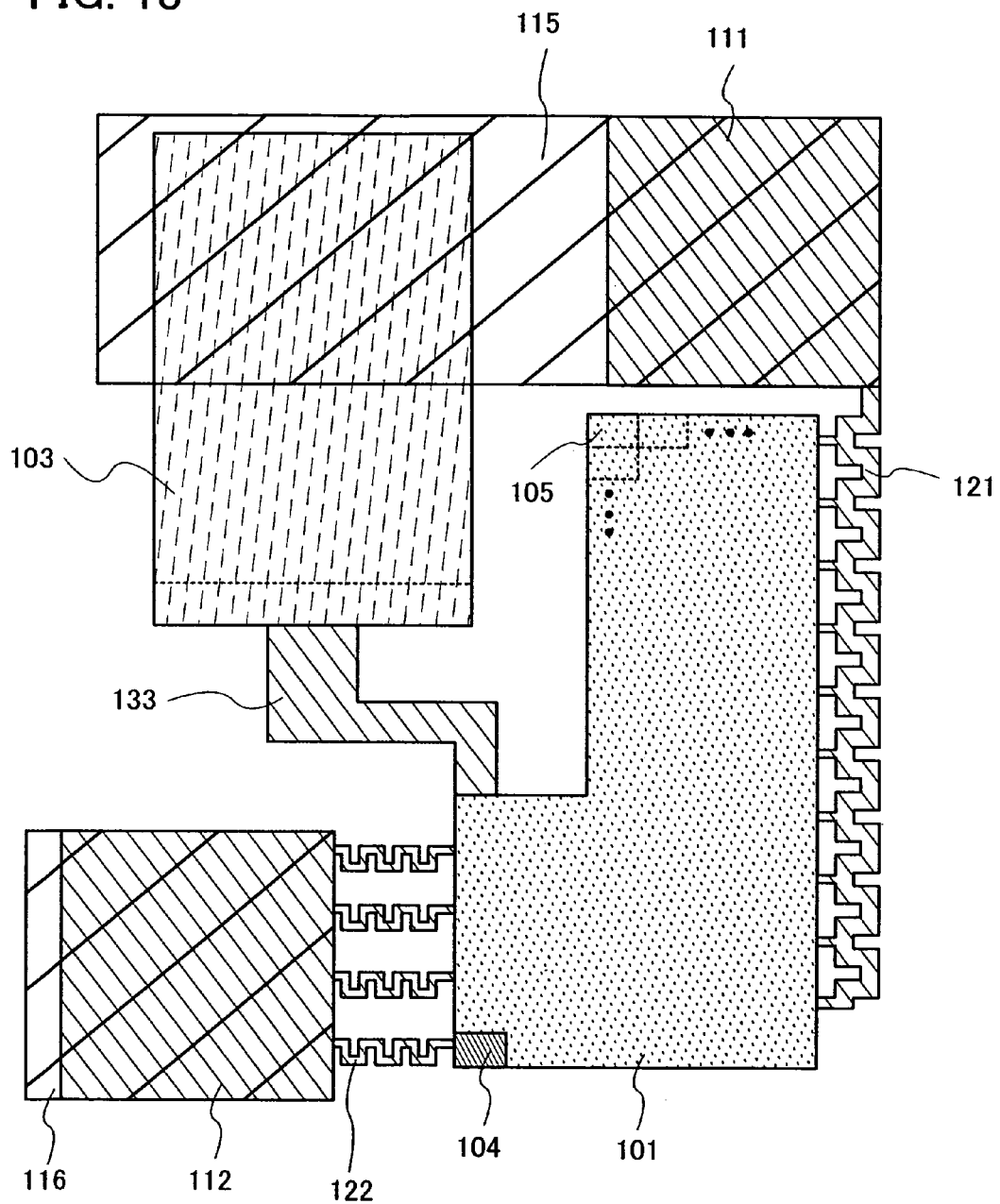
FIG. 18 is a top view of a photoelectric conversion device of the present invention.

Note that the electrode 133 may be formed such that part of the electrode 133, which overlaps with the photodiode 103 is rectangular as shown in FIG. 18 unlike in FIG. 1 where the electrode 133 with a rounded end overlaps with the photodiode 103. When part of the electrode 133, which overlaps with the photodiode 103 is rectangular, electric field concentration can be prevented. Further, if a distance between the electrode 133 and an electrode which is provided opposite to the electrode 133 with the photodiode 103 interposed therebetween (the electrode 232 described later) can be increased when part of the electrode 133, which overlaps with the photodiode 103 is rectangular, electrostatic discharge can also be suppressed. Thus, reliability of a photoelectric conversion element can be improved.

Further, although FIG. 3 shows the current mirror circuit as an equivalent circuit using n-channel TFTs, p-channel TFTs may be used instead of the n-channel TFTs.

Figure 10:
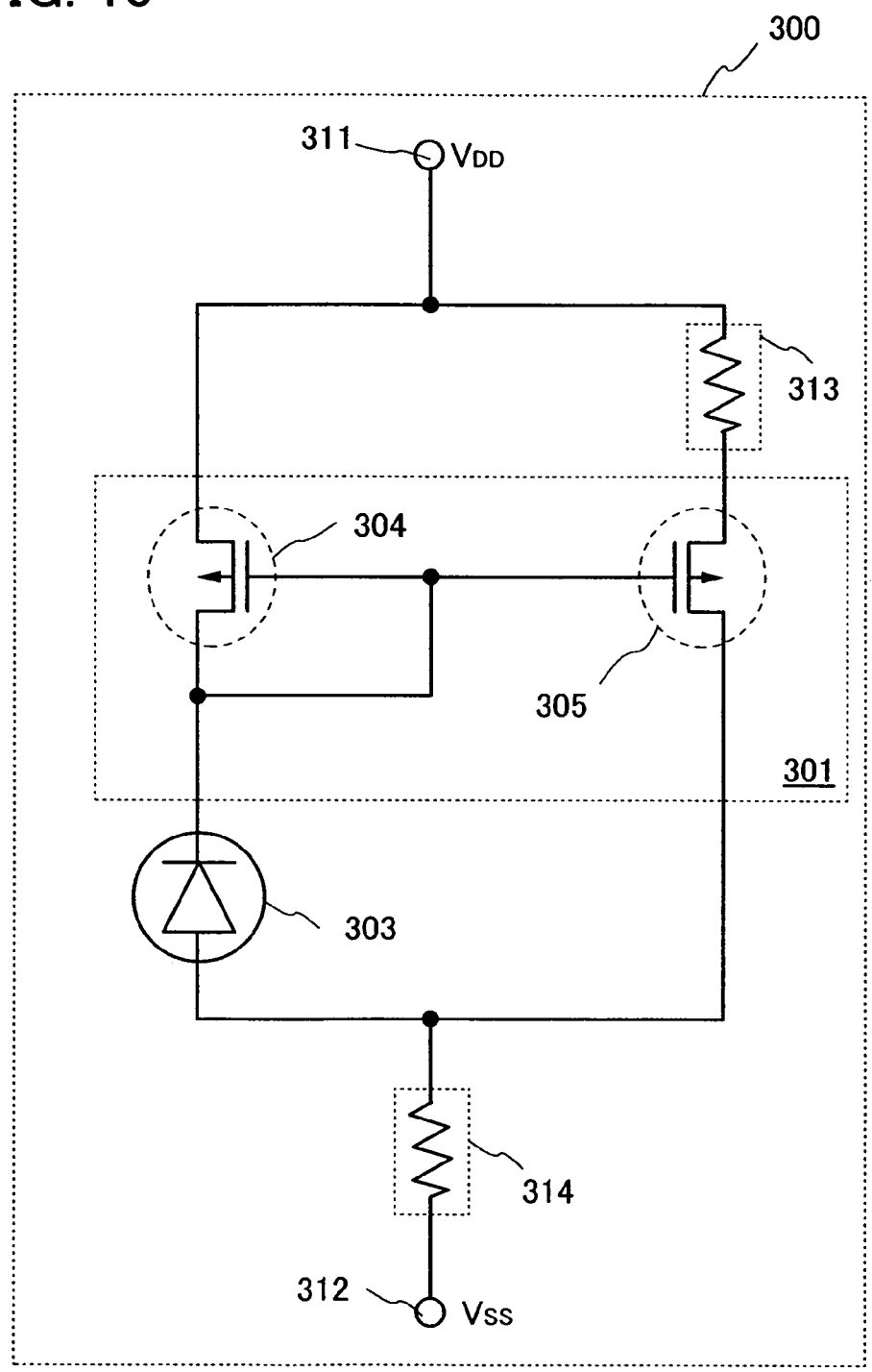
FIG. 10 is a circuit diagram of a photoelectric conversion device of the present invention.

In a case of forming the amplifier circuit using p-channel TFTs, an equivalent circuit of the amplifier circuit is as shown in FIG. 10. A photoelectric conversion device 300 shown in FIG. 10 includes a photodiode 303; a current mirror circuit 301 having p-channel TFTs 304 and 305; a terminal 311 which supplies high-potential power supply voltage $V_{DD}$; a terminal 312 which supplies low-potential power supply voltage $V_{SS}$; a resistor 313 provided between the terminal 311 and the TFT 305; and a resistor 314 provided between the photodiode 303 and the terminal 312 and between the TFT 305 and the terminal 312.

The resistors 313 and 314 are provided to suppress electrostatic discharge similarly to the resistors 113 and 114, and functions of the resistors 313 and 314 are the same as those of the resistors 113 and 114.

In addition, although an example where a top-gate TFT having a structure in which there is one channel formation region (in this specification, referred to as a single gate structure) is used as each of the TFTs 104 and 105 is shown in this embodiment mode, a structure having a plurality of channel formation regions may be used to reduce variations in the on current.

In order to reduce the off current, lightly doped drain (LDD) regions may be provided in the n-channel TFTs 104 and 105. An LDD region is a region to which an impurity element is added at low concentration between a channel formation region and a source region or a drain region which is formed by adding an impurity element at high concentration. When an LDD region is provided, there is an advantageous effect in that an electric field in the vicinity of a drain region is reduced to prevent deterioration due to hot carrier injection.

In order to prevent deterioration of the on current due to hot carriers, the n-channel TFTs 104 and 105 may have a structure in which an LDD region and a gate electrode are provided so as to be overlapped with each other with a gate insulating film interposed therebetween (in this specification, referred to as a GOLD (gate-drain overlapped LDD) structure).

In a case of using a GOLD structure, an advantageous effect in that an electric field in the vicinity of a drain region is reduced to prevent deterioration due to hot carrier injection is further enhanced than a case where an LDD region and a gate electrode are not overlapped with each other. With such a GOLD structure, electric field intensity in the vicinity of the drain region is reduced to prevent hot carrier injection, so that deterioration phenomena are effectively prevented.

Further, the TFTs 104 and 105 included in the current mirror circuit 101 are not limited to top-gate TFTs, and may be bottom-gate TFTs, e.g., inversely staggered TFTs.

Hereinafter, a method for manufacturing a photoelectric conversion device of this embodiment mode is described.

Figure 5A:
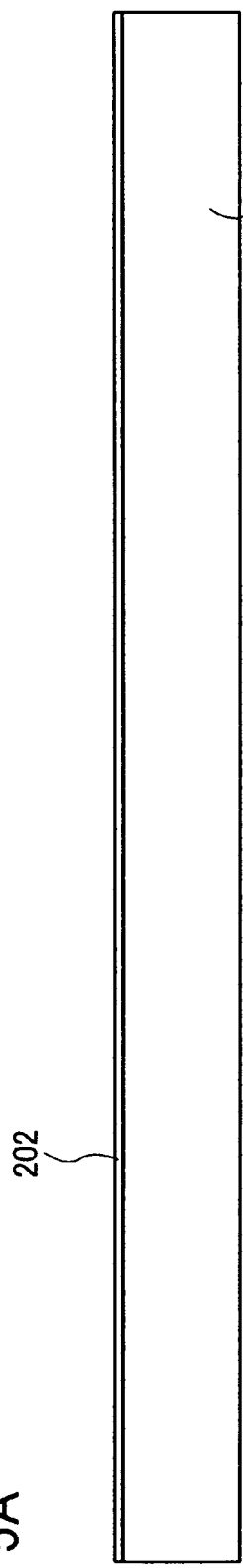
FIGS. 5A to 5C are cross-sectional views illustrating manufacturing steps of a photoelectric conversion device of the present invention.
Figure 5B:
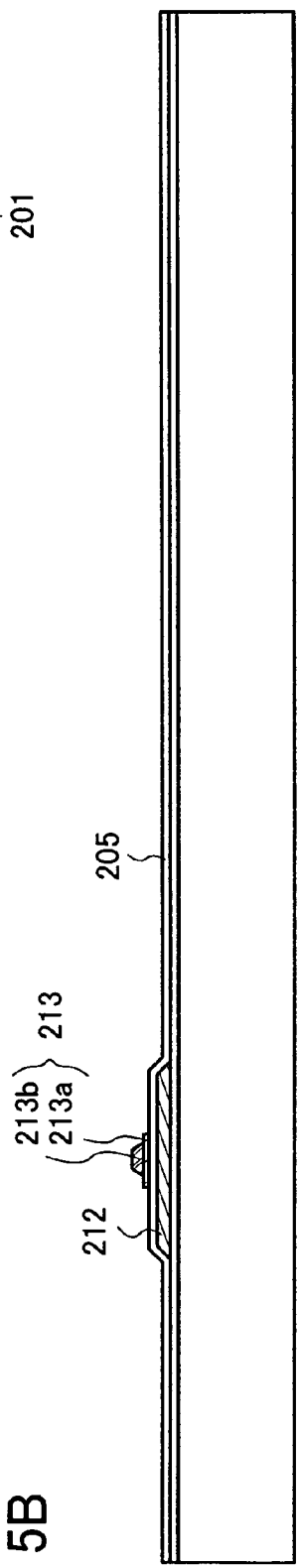

First, an insulating film 202 is formed over a substrate 201 (see FIG. 5A). Any of a glass substrate, a quartz substrate, a ceramic substrate, a silicon substrate, a metal substrate, a stainless steel substrate, and the like can be used for the substrate 201. In this embodiment mode, a glass substrate is used as the substrate 201.

As the insulating film 202, a film formed using silicon oxide, silicon oxide containing nitride, silicon nitride, silicon nitride containing oxygen, or a metal oxide material may be formed by sputtering or plasma CVD.

Alternatively, the insulating film 202 may be formed to have two layers of a lower-layer insulating film and an upper-layer insulating film. For example, it is preferable to use a silicon nitride film containing oxygen ($SiO_xN_y$: y>x) for the lower-layer insulating film and a silicon oxide film containing nitride ($SiO_xN_y$: x>y) for the upper-layer insulating film. When the insulating film 202 is formed to have two layers, moisture or the like from the substrate 201 side can be prevented from being mixed.

Next, a crystalline semiconductor film is formed over the insulating film 202 and the crystalline semiconductor film is etched to be island-shaped to form an island-shaped semiconductor film 212 which serves as an active layer.

In addition, a gate insulating film 205 which covers the island-shaped semiconductor film 212 is formed, and a lower-layer gate electrode 213a and an upper-layer gate electrode 213b are provided over the gate insulating film 205. Although a gate electrode 213 is formed to have two layers of the lower-layer gate electrode 213a and the upper-layer gate electrode 213b in FIG. 8B, the gate electrode 213 may be formed to have a single-layer structure. Further, a source region, a drain region, and a channel formation region are formed in the island-shaped semiconductor film 212.

An interlayer insulating film 206 is formed so as to cover the gate insulating film 205 and the gate electrode 213 having the lower-layer gate electrode 213a and the upper-layer gate electrode 213b.

Note that the interlayer insulating film 206 may be formed to have a single-layer insulating film or may be formed to have a stacked-layer film of insulating layers formed using different materials.

A source electrode 215 and a drain electrode 216 which are electrically connected to the source region and the drain region in the island-shaped semiconductor film 212 are formed over the interlayer insulating film 206. In addition, a gate wiring 214 which is electrically connected to the gate electrode 213 is formed.

Further, electrodes 221, 222, and 223 which are formed using the same materials and through the same steps as the gate wiring 214, the source electrode 215, and the drain electrode 216 are formed over the interlayer insulating film 206. The electrodes 221, 222, and 223 may be formed using different materials and through different steps from those of the gate wiring 214, the source electrode 215, and the drain electrode 216.

The electrode 222 is the same as the electrode 133 in FIG. 1. The electrode 221 is the same as the terminal 112 in FIG. 1. The electrode 223 is the same as the terminal 111. That is, a low potential from a low-potential power source is applied to the electrode 221, and a high potential from a high-potential power source is applied to the electrode 223.

The drain electrode 216 is the same as the wiring 121 in FIG. 1 or is at least formed using the same material as the wiring 121 in FIG. 1. The source electrode 215 is the same as the wiring 122 in FIG. 1 or is at least formed using the same material as the wiring 122 in FIG. 1.

When the drain electrode 216 and the source electrode 215 are not formed linearly but bent in a U-shape or another shape, wiring resistance is increased, so that electrostatic discharge can be suppressed.

Each of the gate wiring 214, the source electrode 215, the drain electrode 216, and electrodes 221, 222, and 223 is formed to have a stacked-layer structure of a high-melting point metal film and a metal film, e.g., a low-resistance metal film. As a material of such a low-resistance metal film, an aluminum alloy, pure aluminum, and the like can be given. In this embodiment mode, as a stacked-layer structure of such a high-melting point metal film and a low-resistance metal film, a three-layer structure in which a titanium film (a Ti film), an aluminum film (an Al film) and a Ti film are sequentially stacked is employed.

Alternatively, instead of a stacked-layer structure of a high-melting point metal film and a low-resistance metal film, a single-layer conductive film can be used. As such a single-layer conductive film, a single-layer film formed using an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), or platinum (Pt), an alloy material or a compound material including any of the above-described elements as a main component; or a single-layer film formed using nitride of any of these elements, e.g., titanium nitride, tungsten nitride, tantalum nitride, or molybdenum nitride can be used.

Figure 5C:
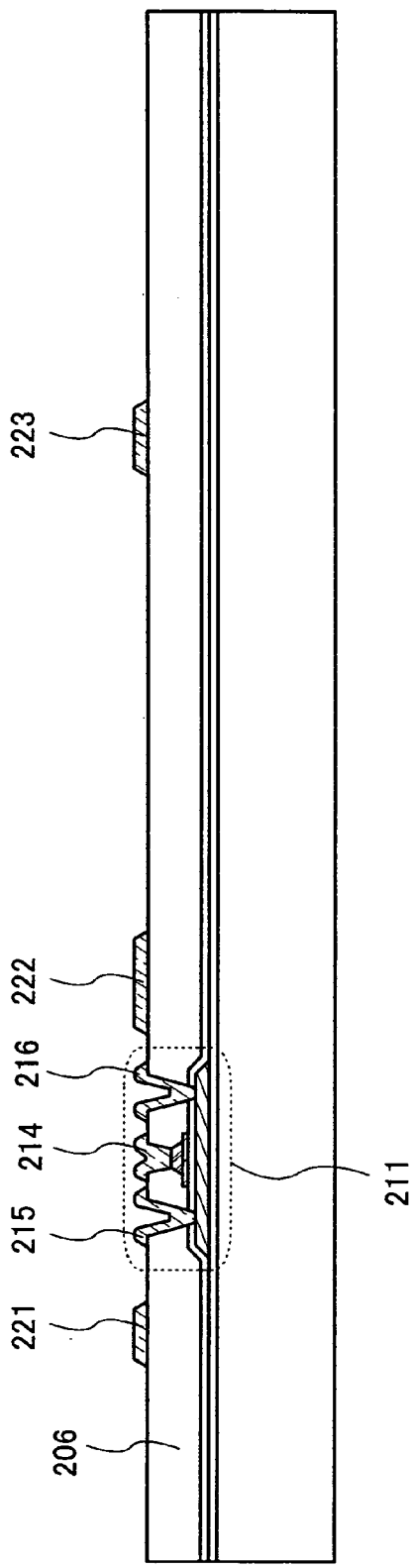

Note that only one TFT is shown in FIG. 5C. However, actually, a TFT 211 is a TFT included in an amplifier circuit which amplifies current obtained in the photodiode 103, e.g., a current mirror circuit, and at least two TFTs 211 are formed.

Note that in this embodiment mode, each of the gate wiring 214, the source electrode 215, the drain electrode 216, and electrodes 221, 222, and 223 is formed using a titanium film where titanium (Ti) is formed with a thickness of 400 nm.

Figure 6A:
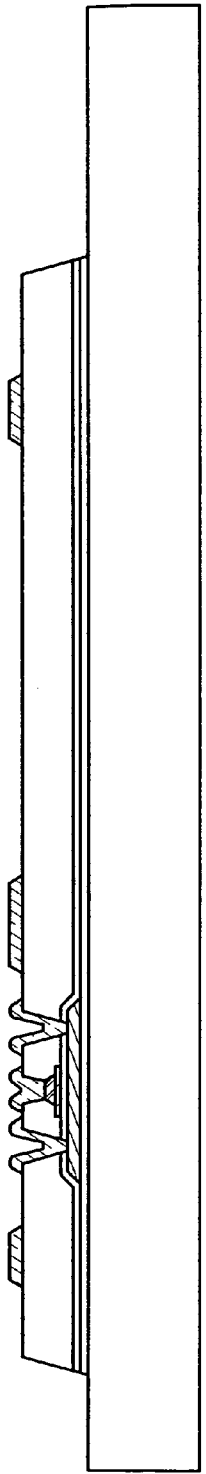
FIGS. 6A to 6C are cross-sectional views illustrating manufacturing steps of a photoelectric conversion device of the present invention.

Subsequently, etching is performed so that edges of the interlayer insulating film 206, the gate insulating film 205, and the insulating film 202 are tapered (see FIG. 6A).

When the edges of the interlayer insulating film 206, the gate insulating film 205, and the insulating film 202 are tapered, coverage of a protection film 227 which is formed over these films is improved, so that an advantageous effect in that moisture, an impurity, or the like cannot easily enter can be obtained.

Subsequently, a p-type semiconductor film, an i-type semiconductor film, and an n-type semiconductor film are formed over the interlayer insulating film 206 and the electrode 222 and are etched to form a photoelectric conversion layer 225 which includes a p-type semiconductor layer 225p, an i-type semiconductor layer 225i, and an n-type semiconductor layer 225n (see FIG. 6B).

The p-type semiconductor layer 225p may be formed using an amorphous semiconductor film including an impurity element belonging to Group 13, e.g., boron (B) by plasma CVD.

Figure 6B:
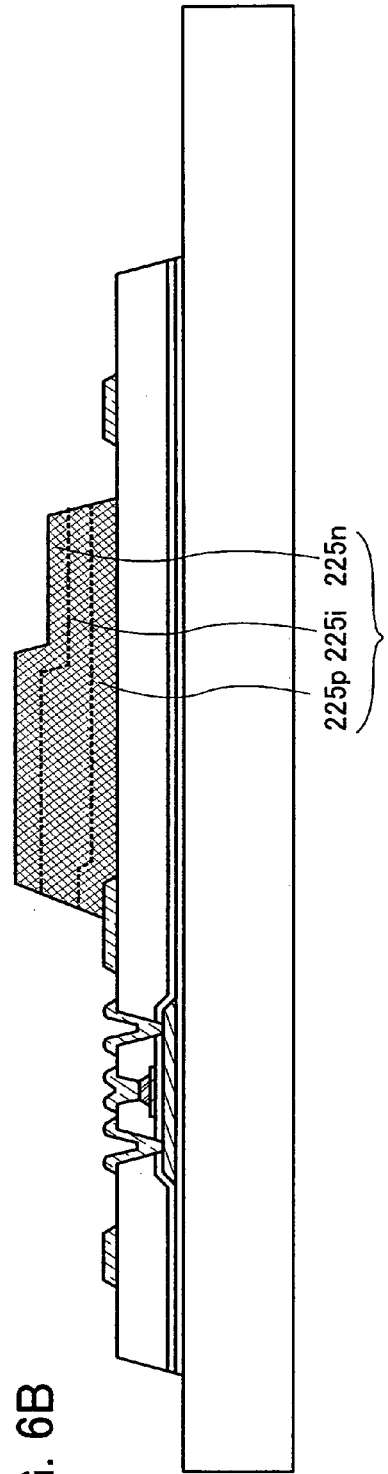

In FIG. 6B, the electrode 222 is in contact with the lowest layer of the photoelectric conversion layer 225, i.e., the p-type semiconductor layer 225p in this embodiment mode.

As the i-type semiconductor layer 225i, for example, an amorphous semiconductor film may be formed by plasma CVD. In addition, as the n-type semiconductor layer 225n, an amorphous semiconductor film including an impurity element belonging to Group 15, e.g., phosphorus (P) may be formed. Alternatively, after an amorphous semiconductor film is formed, an impurity element belonging to Group 15 may be introduced.

Note that as an amorphous semiconductor film, an amorphous silicon film, an amorphous germanium film, or the like may be used.

Note that in this specification, an i-type semiconductor film corresponds to a semiconductor film in which concentration of an impurity which imparts p-type or n-type conductivity is $1 \times 10^{20}$ cm$^{-3}$ or less, concentration of oxygen and nitrogen is $5 \times 10^{19}$ cm$^{-3}$ or less, and photoconductivity exceeds dark conductivity by 100 times or more. In addition, 10 to 1000 ppm of boron (B) may be added to the i-type semiconductor film.

As each of the p-type semiconductor layer 225p, the i-type semiconductor layer 225i, and the n-type semiconductor layer 225n, a microcrystalline semiconductor film (also referred to as a semi-amorphous semiconductor film) may be used as well as an amorphous semiconductor film.

Alternatively, each of the p-type semiconductor layer 225p and the n-type semiconductor layer 225n may be formed using a microcrystalline semiconductor film, and the i-type semiconductor layer 225i may be formed using an amorphous semiconductor film.

Note that a semi-amorphous semiconductor film corresponds to a film which includes a semiconductor having an intermediate structure between an amorphous semiconductor and a semiconductor having a crystalline structure (including a single crystal and a polycrystal). The semi-amorphous semiconductor film corresponds to a semiconductor film having a third condition which is stable in terms of free energy and corresponds to a crystalline substance having a short-range order and lattice distortion, and the semi-amorphous semiconductor film having a crystal grain size of 0.5 to 20 nm can be dispersed in a non-single crystalline semiconductor film. As for the semi-amorphous semiconductor film, Raman spectrum thereof is shifted to a wave number side lower than 520 $cm^{-1}$, and the diffraction peaks of (111) and (220) which are said to be caused by a Si crystal lattice are observed in X-ray diffraction. In addition, the semi-amorphous semiconductor film includes hydrogen or halogen of at least 1 atomic percent or more to terminate a dangling bond. In this specification, such a semiconductor film is referred to as a semi-amorphous semiconductor (SAS) film for convenience. Further, a rare gas element such as helium, argon, krypton, or neon is included to further promote lattice distortion, so that stability is improved and an excellent semi-amorphous semiconductor film can be obtained. Note that a microcrystalline semiconductor film (a microcrystal semiconductor film) also corresponds to a semi-amorphous semiconductor film.

In addition, the SAS film can be obtained by glow discharge decomposition of gas containing silicon. A typical example of gas containing silicon is $SiH_4$, and $Si_2H_6$, $SiH_2Cl_2$, $SiHCl_3$, $SiCl_4$, $SiF_4$, or the like can also be used. The gas containing silicon is diluted with hydrogen, or gas in which one or more rare gas elements such as helium, argon, krypton, and neon are added to hydrogen, so that the SAS film can be formed easily. It is preferable to use a dilution ratio in a range of 2 to 1000 times to dilute the gas containing silicon. Further, carbide gas such as $CH_4$ or $C_2H_6$, germanium gas such as $GeH_4$ or $GeF_4$, $F_2$, or the like may be mixed in the gas containing silicon to adjust an energy band width to be 1.5 to 2.4 eV or 0.9 to 1.1 eV.

Note that in this specification, each of the photoelectric conversion layer 225, the photodiode 103 including the photoelectric conversion layer 225, and an element having the photodiode 103 is referred to as a photoelectric conversion element or a photoelectric conversion device.

Figure 6C:
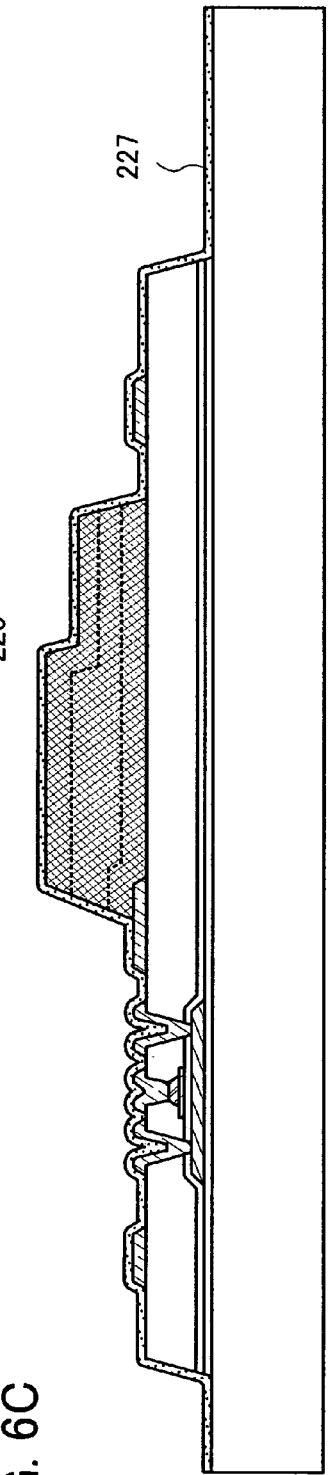

Subsequently, the protection film 227 is formed so as to cover an exposed surface (see FIG. 6C). A silicon nitride film is used as the protection film 227 in this embodiment mode. With the protection film 227, moisture, an impurity such as an organic substance, or the like can be prevented from being mixed into the TFT 211 or the photoelectric conversion layer 225.

Figure 7A:
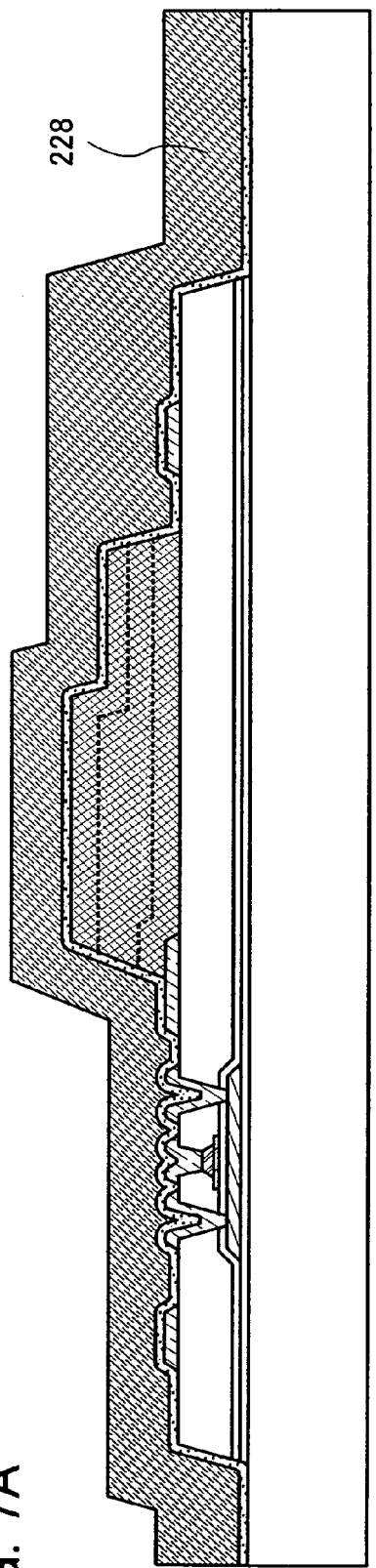
FIGS. 7A and 7B are cross-sectional views illustrating manufacturing steps of a photoelectric conversion device of the present invention.
Figure 7B:
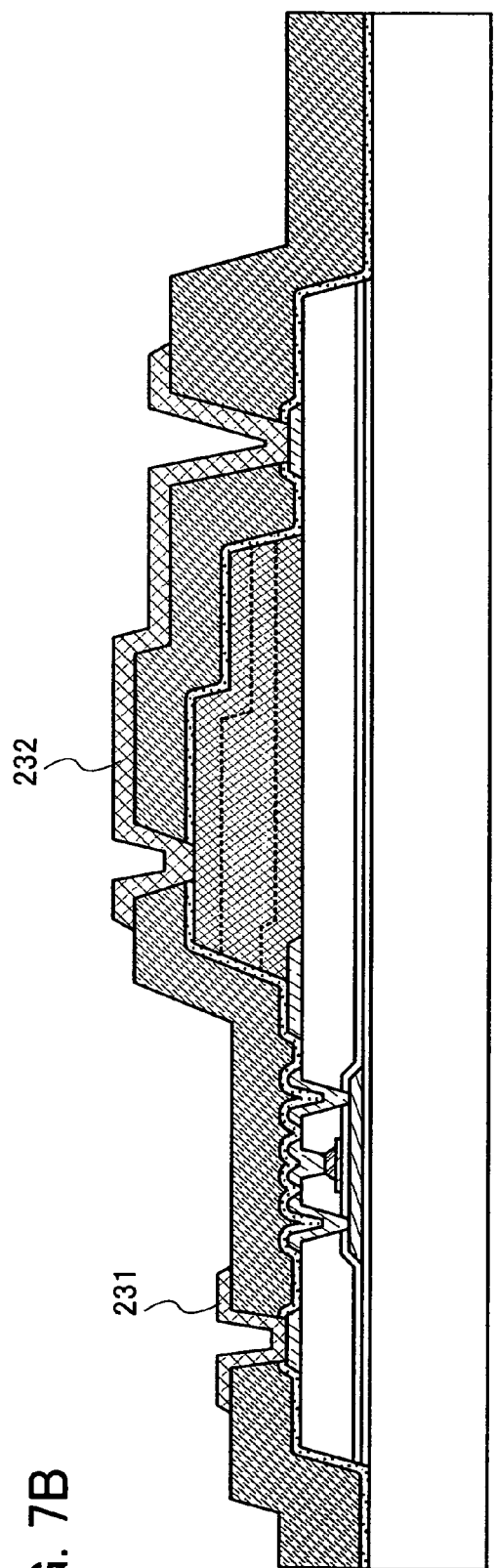

Subsequently, an interlayer insulating film 228 is formed over the protection film 227 (see FIG. 7A). The interlayer insulating film 228 also serves as a planarization film. In this embodiment mode, for the interlayer insulating film 228, polyimide is formed with a thickness of 2 μm.

Next, the interlayer insulating film 228 is etched to form contact holes. At this time, since the protection film 227 is provided, the gate wiring 214, the source electrode 215, and the drain electrode 215 of the TFT 211 are not etched. Subsequently, part of the protection film 227 where the electrode 231 and the electrode 232 are formed is etched to form contact holes. In addition, the electrode 231 which is electrically connected to the electrode 221 through one of the contact holes formed in the interlayer insulating film 228 and the protection film 227, and the electrode 232 which is electrically connected to the upper layer of the photoelectric conversion layer 225 (in this embodiment mode, the n-type semiconductor layer 225n) through the other contact hole formed in the interlayer insulating film 228 and the protection film 227 are formed over the interlayer insulating film 228 (see FIG. 7B). For the electrode 231 and the electrode 232, tungsten (W), titanium (Ti), tantalum (Ta), silver (Ag), or the like can be used.

The electrode 231 is the same as the wiring 116 in FIG. 1 or is at least formed using the same material as the wiring 116 in FIG. 1. The electrode 232 is the same as the wiring 115 in FIG. 1 or is at least formed using the same material as the wiring 115 in FIG. 1.

In this embodiment mode, a conductive film where titanium (Ti) is formed with a thickness of 30 to 50 nm is used for the electrode 231 and the electrode 232.

Figure 8:
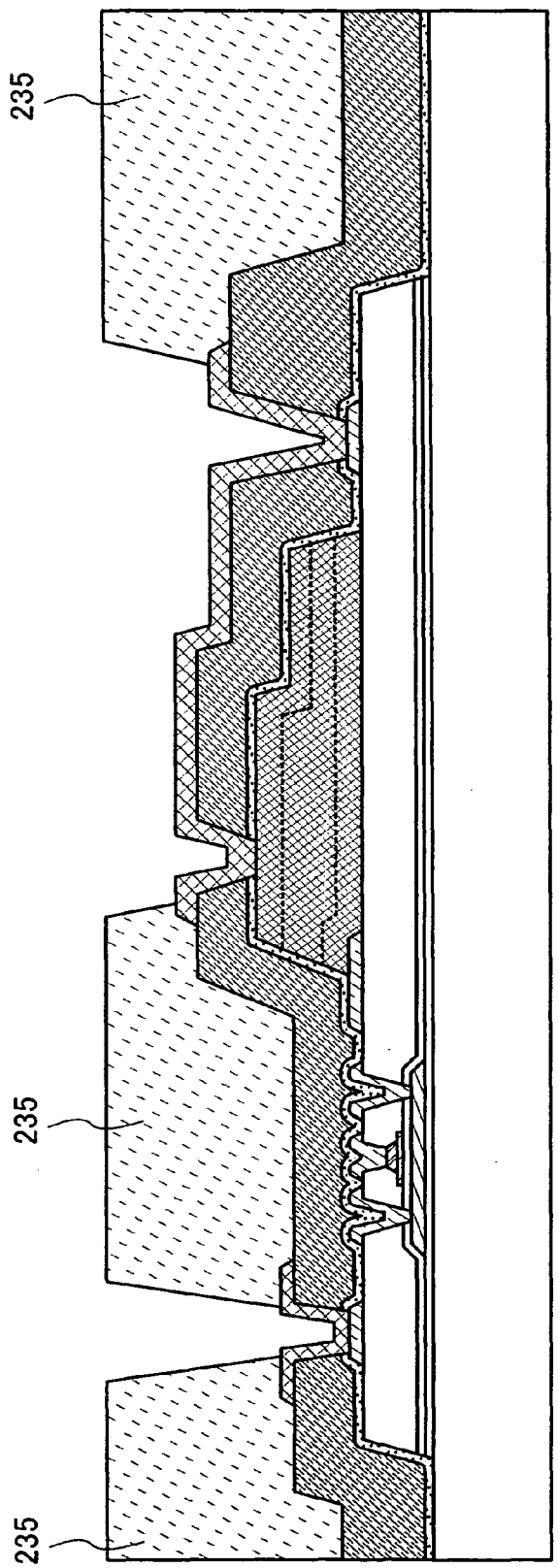
FIG. 8 is a cross-sectional view illustrating a manufacturing step of a photoelectric conversion device of the present invention.

Subsequently, an interlayer insulating film 235 is formed over the interlayer insulating film 228 by screen printing or an ink-jet method (see FIG. 8). In that case, the interlayer insulating film 235 is not formed over the electrode 231 and the electrode 232. In this embodiment mode, an epoxy resin is used for the interlayer insulating film 235.

Subsequently, for example, an electrode 241 which is electrically connected to the electrode 231 and an electrode 242 which is electrically connected to the electrode 232 are formed over the interlayer insulating film 235 by a printing method using nickel (Ni) paste. In addition, an electrode 243 and an electrode 245 are formed over the electrode 241 and electrode 242, respectively, by a printing method using copper (Cu) paste (see FIG. 4).

As described above, the photoelectric conversion device of this embodiment mode is manufactured. When the photoelectric conversion device of this embodiment mode is used, electrostatic discharge can be suppressed without changing the size of the whole photoelectric conversion device. Thus, reliability of the photoelectric conversion device and a semiconductor device having the photoelectric conversion device can be improved.

Embodiment Mode 2

In this embodiment mode, a photoelectric conversion device having a structure which is different from that of Embodiment Mode 1 is described with reference to FIG. 11, FIGS. 12A and 12B, and FIG. 19.

Note that like portions in this embodiment mode and Embodiment Mode 1 are denoted by the same reference numerals based on the description of Embodiment Mode 1.

Figure 11:
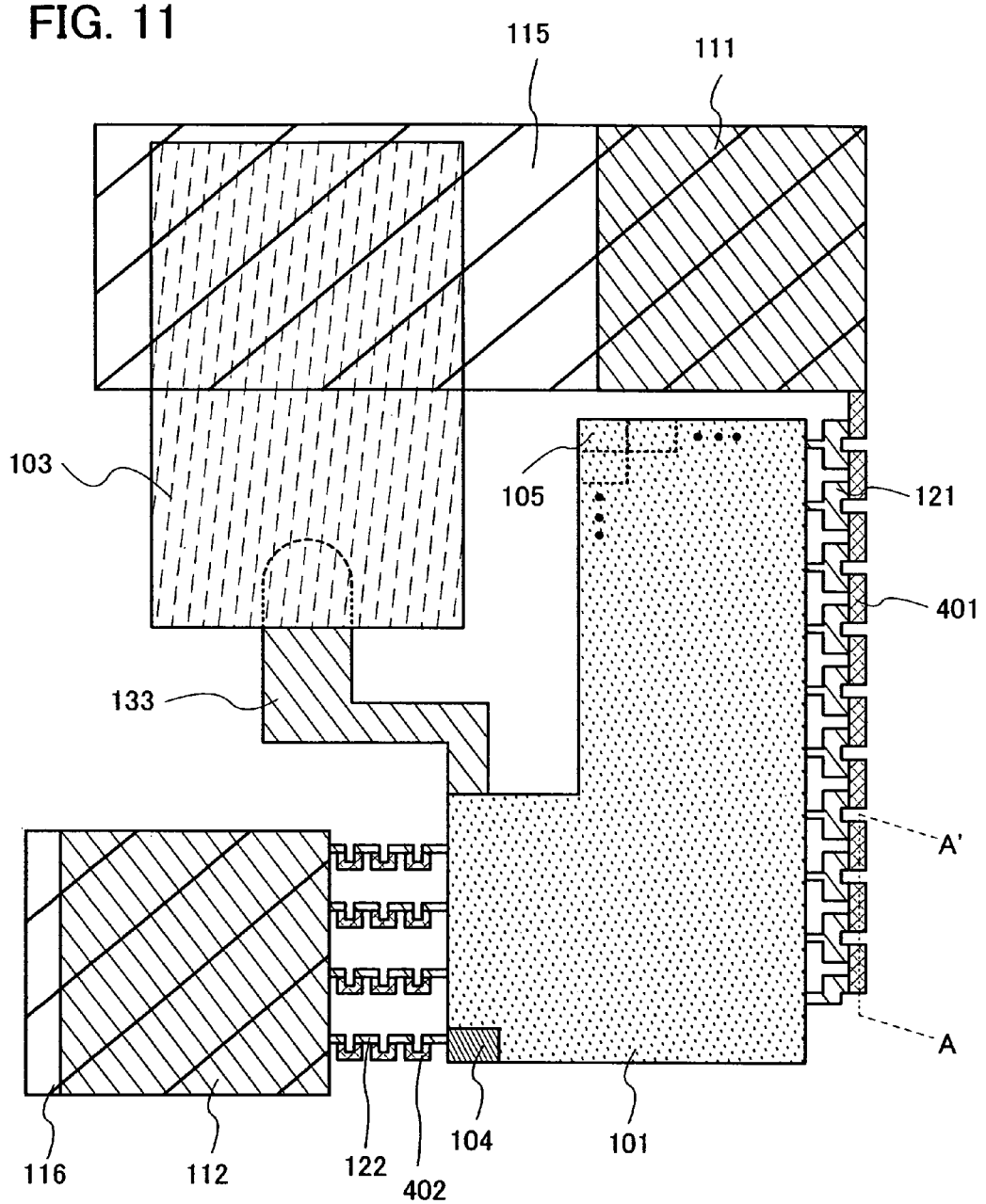
FIG. 11 is a top view of a photoelectric conversion device of the present invention.

FIG. 11 shows a photoelectric conversion device of this embodiment mode. FIG. 11 of this embodiment mode is different from FIG. 1 of Embodiment Mode 1 in that an electrode 401 is formed over the wiring 121 and an electrode 402 is formed over the wiring 122.

When the electrode 401 and the electrode 402 are formed, resistance values of the resistor 113 and the resistor 114, which are wiring resistance, are increased. Thus, electrostatic discharge can be further suppressed.

Figure 12A:
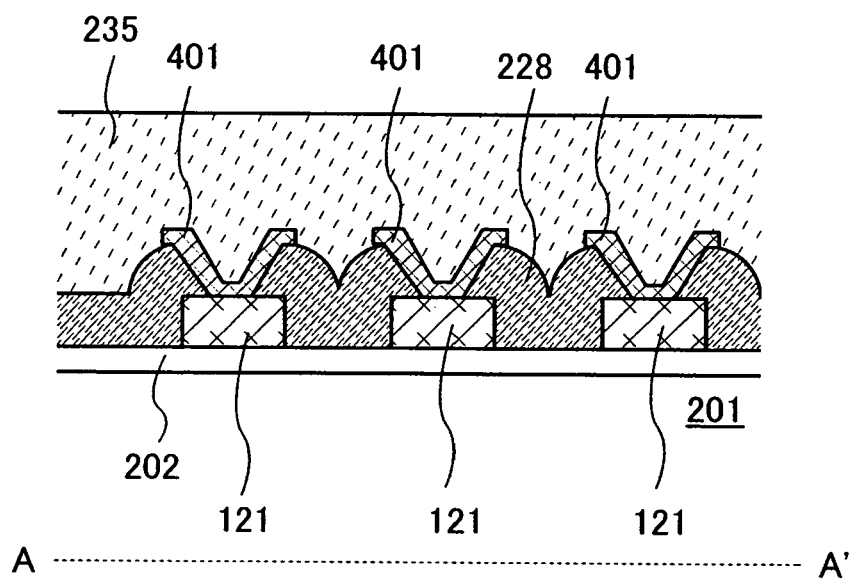
FIGS. 12A and 12B are cross-sectional views illustrating manufacturing steps of a photoelectric conversion device of the present invention.

FIG. 12A shows a cross section taken along line A-A' in FIG. 11. The wiring 121 is formed over the insulating film 202 which is over the substrate 201, and the interlayer insulating film 228 covers the wiring 121. The electrode 401 which is formed using the same material and through the same manufacturing steps as the electrode 231 and the electrode 232 is formed over the interlayer insulating film 228, and the electrode 401 is electrically connected to the wiring 121. In addition, the interlayer insulating film 235 is formed so as to cover the electrode 401.

Figure 12B:
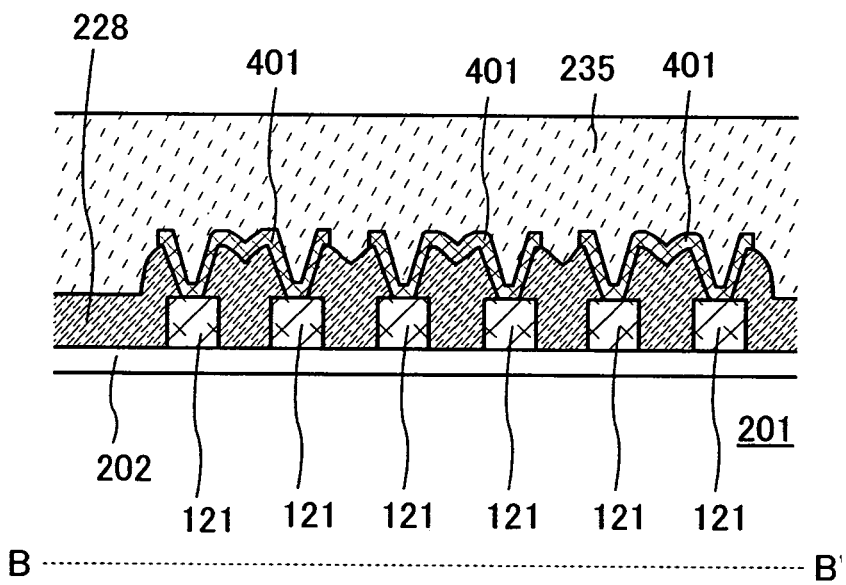
Figure 19:
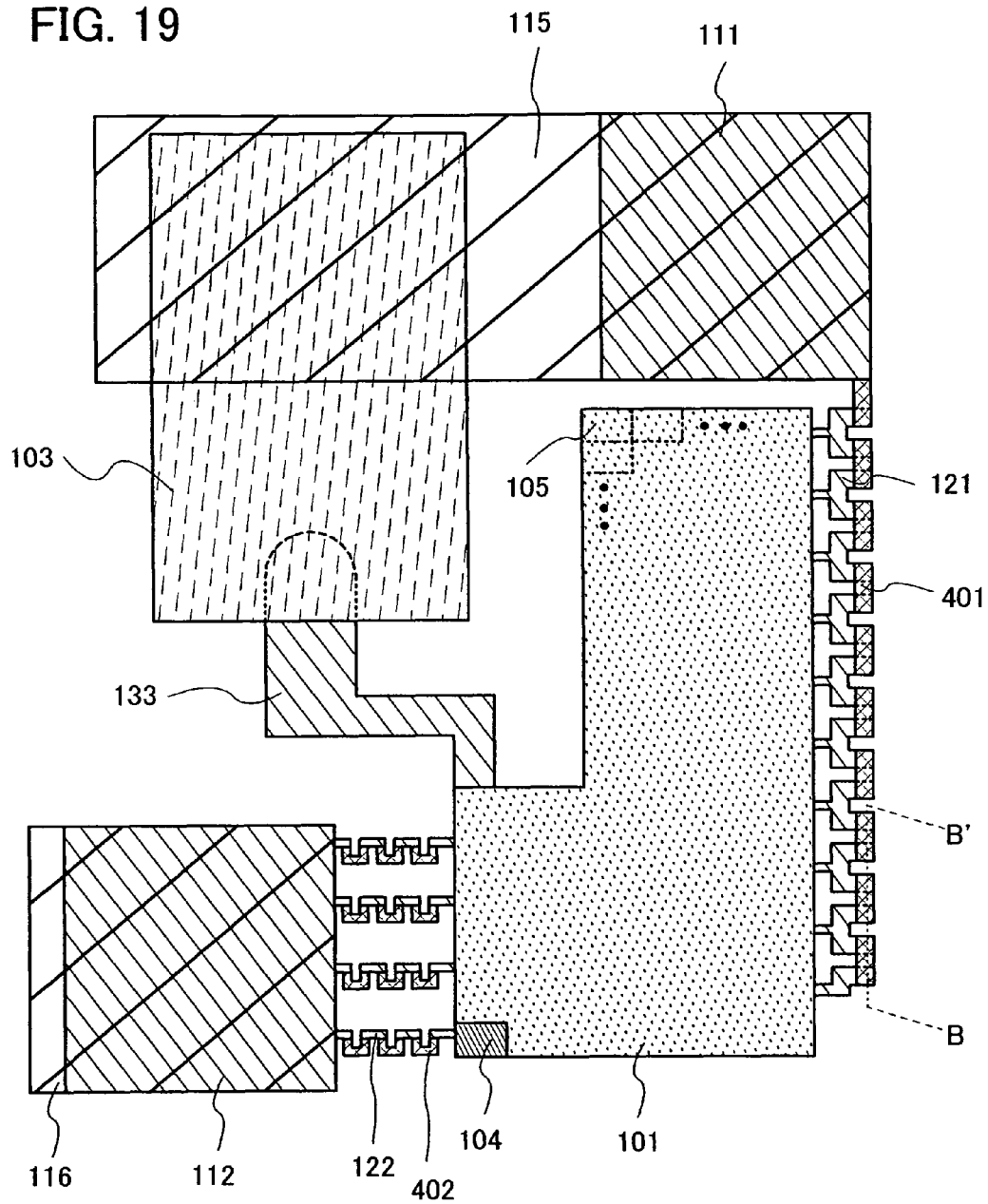
FIG. 19 is a top view of a photoelectric conversion device of the present invention.

Note that in a photoelectric conversion device shown in FIG. 19, electric connection between the wiring 121 and the electrode 401 is different from that of the photoelectric conversion device shown in FIG. 11. FIG. 12B shows a cross section taken along line B-B' in FIG. 19, and the wiring 121 and the electrode 401 are connected alternately in a perpendicular direction. With such a structure, wiring resistance is further increased, so that electrostatic discharge can be further suppressed.

Note that connection between the wiring 122 and the electrode 402 may be the same as connection between the wiring 121 and the electrode 401 in FIG. 12B.

When the photoelectric conversion device of this embodiment mode is used, resistance values of the resistor 113 and the resistor 114 can be increased. Thus, electrostatic discharge can be suppressed without changing the size of the whole photoelectric conversion device. Thus, reliability of the photoelectric conversion device and a semiconductor device having the photoelectric conversion device can be improved.

Embodiment Mode 3

In this embodiment, examples are described in which photoelectric conversion devices obtained in Embodiment Modes 1 and 2 are incorporated in various electronic devices. As examples of electronic devices shown in this embodiment mode, a computer, a display, a mobile phone, a television receiver, and the like can be given. Specific examples of those electronic devices are shown in FIG. 13, FIGS. 14A and 14B, FIGS. 15A and 15B, FIG. 16, and FIGS. 17A and 17B.

Figure 13:
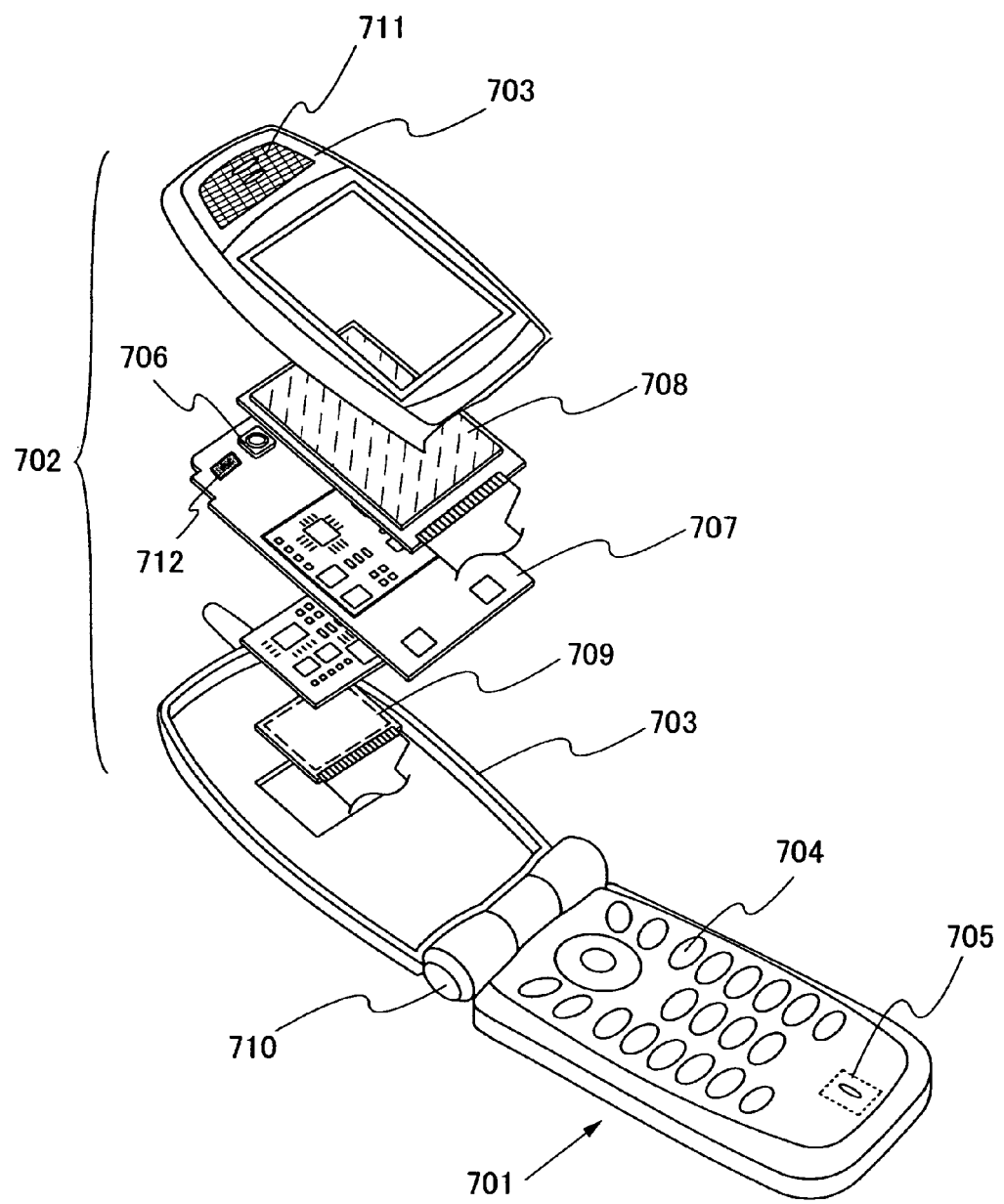
FIG. 13 illustrates a device on which a semiconductor device of the present invention is mounted.

FIG. 13 is a mobile phone, which includes a main body (A) 701, a main body (B) 702, a housing 703, operation keys 704, an audio input portion 705, an audio output portion 706, a circuit substrate 707, a display panel (A) 708, a display panel (B) 709, a hinge 710, a light-transmitting material portion 711, and an photoelectric conversion device 712 which is obtained in Embodiment Modes 1 and 2.

The photoelectric conversion device 712 detects light which is transmitted through the light-transmitting material portion 711, controls luminance of the display panel (A) 708 and the display panel (B) 709 in accordance with illuminance of detected external light, and controls illumination of the operation keys 704 in accordance with illuminance obtained by the photoelectric conversion device 712. Thus, power consumption of the mobile phone can be suppressed.

Figure 14A:
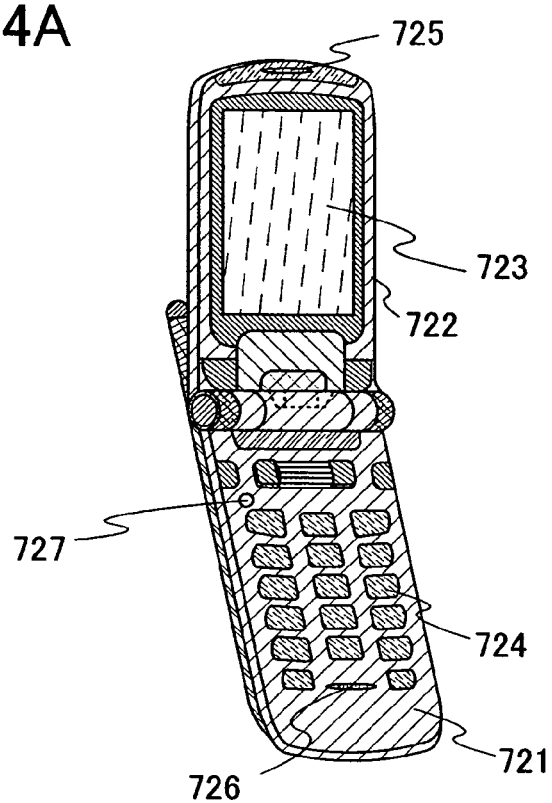
FIGS. 14A and 14B each illustrate a device on which a semiconductor device of the present invention is mounted.
Figure 14B:
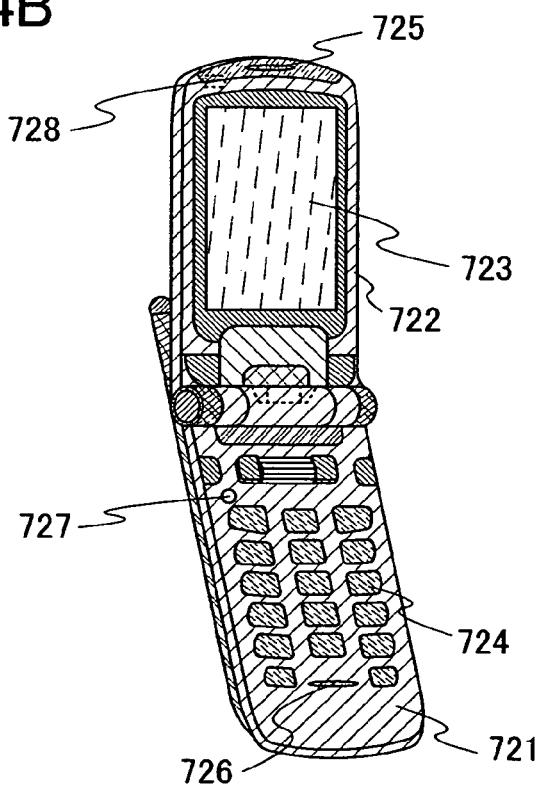

Next, FIGS. 14A and 14B show other examples of a mobile phone. Each of the mobile phone in FIGS. 14A and 14B includes a main body 721, a housing 722, a display panel 723, operation keys 724, an audio output portion 725, an audio input portion 726, and photoelectric conversion devices 727 and 728 obtained in Embodiment Modes 1 and 2.

In the mobile phone shown in FIG. 14A, luminance of the display panel 723 and the operation keys 724 can be controlled by detecting external light with the photoelectric conversion device 727 provided in the main body 721.

In the mobile phone shown in FIG. 14B, the photoelectric conversion device 728 is provided inside the main body 721 in addition to the structure of FIG. 14A. Luminance of a backlight provided for the display panel 723 can also be detected and controlled by the photoelectric conversion device 728.

Figure 15A:
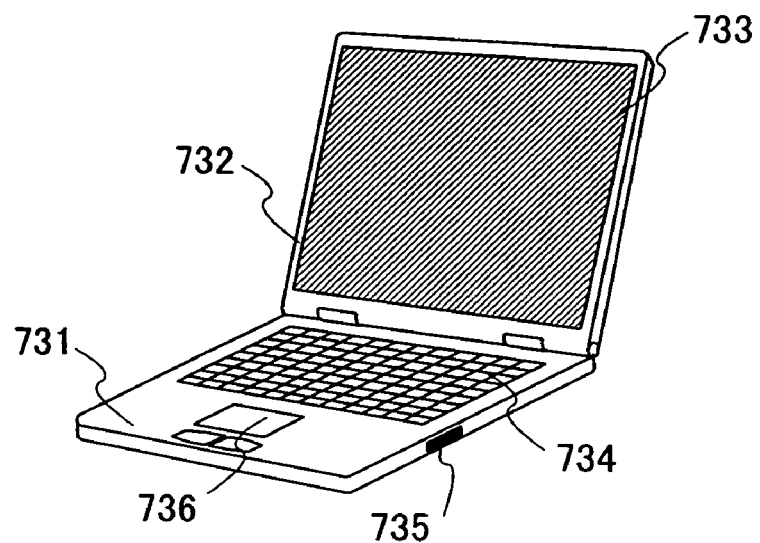
FIGS. 15A and 15B each illustrate a device on which a semiconductor device of the present invention is mounted.

FIG. 15A shows a computer, which includes a main body 731, a housing 732, a display portion 733, a keyboard 734, an external connection port 735, a pointing device 736, and the like.

Figure 15B:
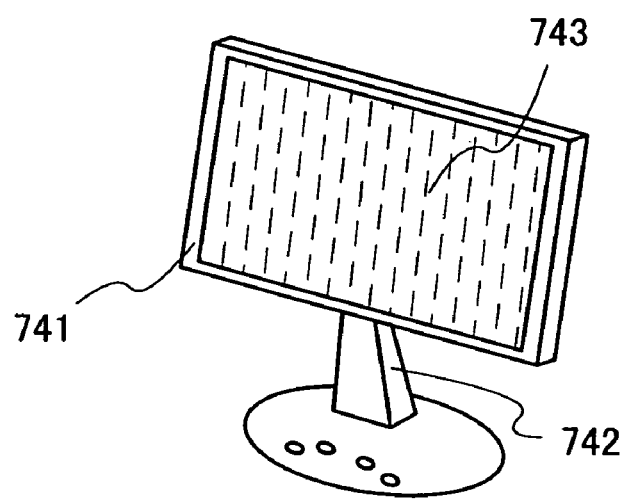

FIG. 15B shows a display device, and a TV receiver or the like corresponds to this. The display device includes a housing 741, a support base 742, a display portion 743, and the like.

Figure 16:
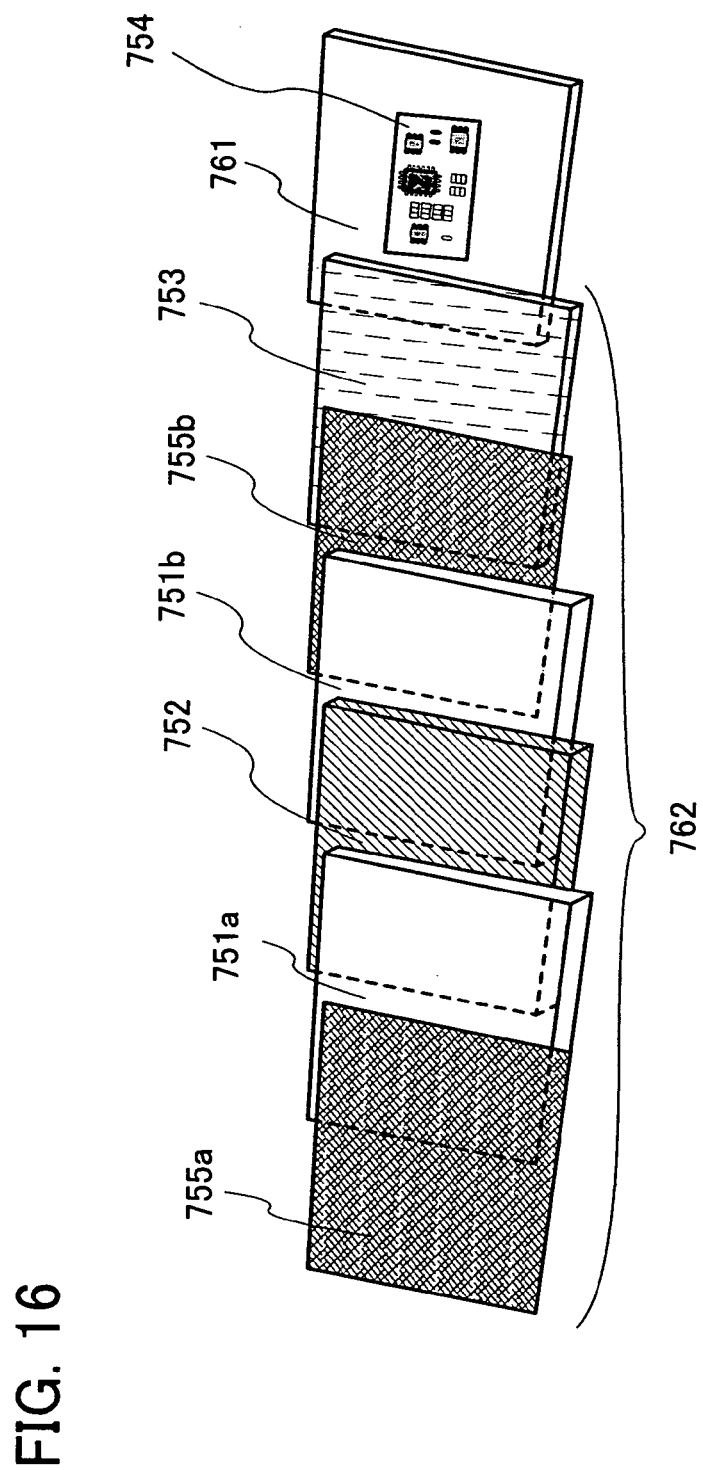
FIG. 16 illustrates a device on which a semiconductor device of the present invention is mounted.

FIG. 16 shows a detailed structure of the case where a liquid crystal panel is used for the display portion 733 provided in the computer of FIG. 15A and the display portion 743 of the display device shown in FIG. 15B.

A liquid crystal panel 762 shown in FIG. 16 is incorporated in a housing 761 and includes substrates 751a and 751b, a liquid crystal layer 752 sandwiched between the substrates 751a and 751b, polarizing filters 755a and 755b, a backlight 753, and the like. A photoelectric conversion device formation region 754 having the photoelectric conversion device obtained in Embodiment Modes 1 and 2 is formed in the housing 761.

The photoelectric conversion device formation region 754 detects the amount of light from the backlight 753, and luminance of the liquid crystal panel 762 is adjusted when information thereof is fed back.

Figure 17A:
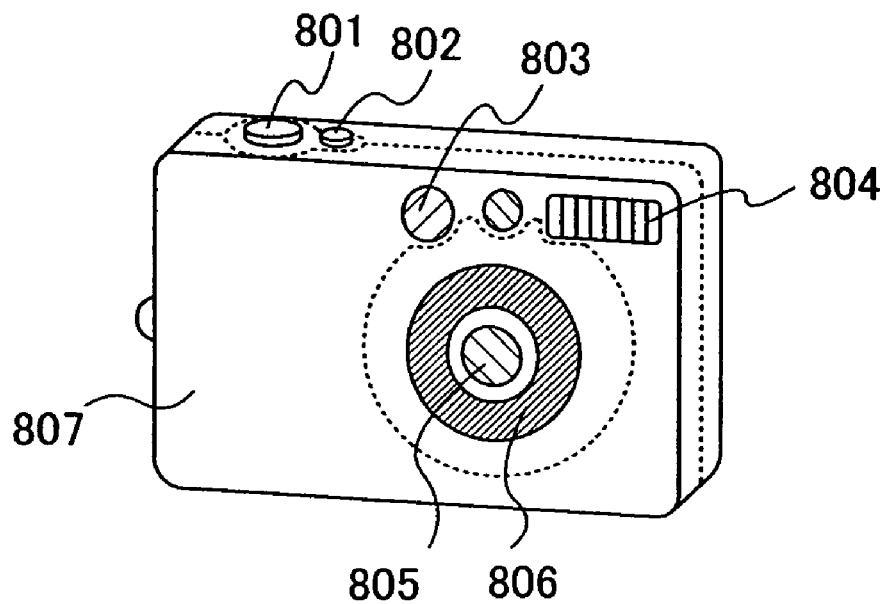
FIGS. 17A and 17B illustrate a device on which a semiconductor device of the present invention is mounted.
Figure 17B:
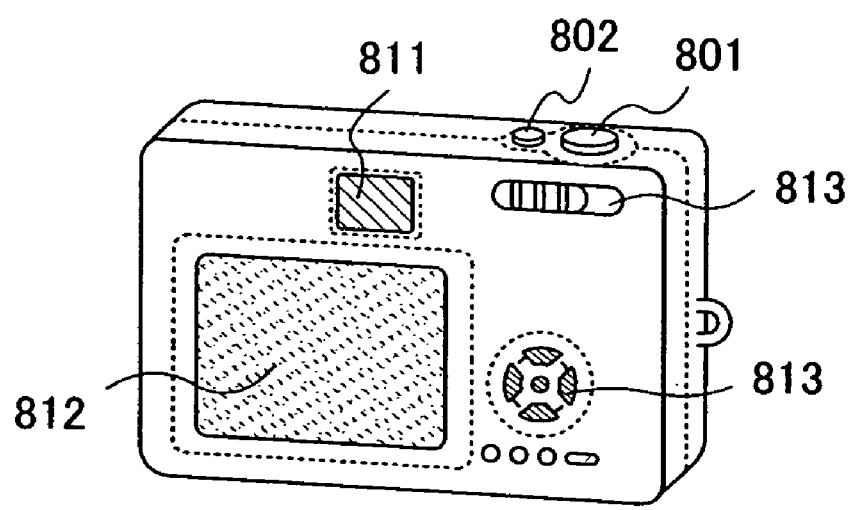

FIGS. 17A and 17B show an example in which the photoelectric conversion device is incorporated in a camera such as a digital camera. FIG. 17A is a front perspective view of the digital camera, and FIG. 17B is a back perspective view of the digital camera.

In FIG. 17A, the digital camera includes a release button 801, a main switch 802, a finder window 803, a flash portion 804, a lens 805, a lens barrel 806, and a housing 807.

In addition, in FIG. 17B, a finder eyepiece window 811, a monitor 812, and operation buttons 813 are included.

When the release button 801 is pressed down halfway, a focus adjusting mechanism and an exposure adjusting mechanism are operated, and a shutter is opened when the release button is fully pressed down.

The main switch 802 switches ON/OFF of a power source of the digital camera by being pressed or rotated.

The finder window 803 is provided above the lens 805 of the front side of the digital camera, and is a device for confirming an area which is photographed or a focus position from the finder eyepiece window 811 shown in FIG. 17B.

The flash portion 804 is provided at the upper portion of the front side of the digital camera, and when luminance of an object is low, auxiliary light is emitted at the same time as the release button is pressed down and the shutter is opened.

The lens 805 is provided at the front face of the digital camera. The lens 805 is formed using a focusing lens, a zoom lens, or the like, and forms a photographing optical system with the shutter and a diaphragm which are not shown. In addition, an image pickup device such as CCD (charge coupled device) is provided at the back of the lens 805.

The lens barrel 806 moves a position of the lens 805 to adjust the focus of the focusing lens, the zoom lens, or the like. At the time of photographing, the lens barrel 806 is slid out to move the lens 805 forward. Further, when the camera is carried, the lens 805 is moved backward and made compact. Note that although a structure in which the lens barrel is slid out so that an object can be enlarged and photographed is employed in this embodiment mode, the present invention is not limited this structure. A structure may be employed in which zoom shooting can be performed without sliding out the lens barrel by using the photographing optical system inside the housing 807.

The finder eyepiece window 811 is provided at the upper portion of the back surface of the digital camera and is a window for looking through when recognizing an area which is taken or a focus point.

The operation buttons 813 are buttons for various functions which are provided at the back surface of the digital camera and include a setup button, a menu button, a display button, a functional button, a selection button, and the like.

When the photoelectric conversion device is incorporated in the camera shown in FIGS. 17A and 17B, the photoelectric conversion device can detect existence or nonexistence of light and light intensity, so that exposure adjustment or the like of the camera can be performed.

In addition, the photoelectric conversion device of the present invention can be applied to other electronic devices such as a projection television and a navigation system. That is, the photoelectric conversion device of the present invention can be used for any device where light is necessary to be detected.

This application is based on Japanese Patent Application serial no. 2007-079763 filed with Japan Patent Office on Mar. 26, 2007, the entire contents of which are hereby incorporated by reference.

What is claimed is:

1. A semiconductor device comprising:
a first terminal electrically connected to a first electric power source, the first terminal supplying a first electric potential;
a photoelectric conversion element electrically connected to the first terminal, the photoelectric conversion element outputting a first voltage;
a first transistor including a first gate electrode, a first drain electrode and a first source electrode, the first gate electrode and the first drain electrode being electrically connected to the photoelectric conversion element, the first transistor outputting a first current from the first source electrode by the first voltage applied to the first gate electrode;
a first wiring electrically connected to the first terminal in parallel to the photoelectric conversion element;
a second transistor including a second gate electrode, a second drain electrode and a second source electrode, the second gate electrode being electrically connected to the photoelectric conversion element, the second drain electrode being electrically connected to the first wiring, the second transistor outputting a second current from the second source electrode by the first voltage applied to the second gate electrode;
a second wiring electrically connected to a point where the first source electrode and the second source electrode are electrically connected to each other; and
a second terminal electrically connected to the second wiring, the second terminal supplying a second electric potential lower than the first electric potential,
wherein the first current and the second current flow in the second wiring,
wherein the first wiring and the second wiring are provided in a meandering shape,
wherein the first wiring includes a plurality of island-shaped first conductors and a plurality of island-shaped second conductors, and
wherein the plurality of island-shaped first conductors are electrically connected alternately by the plurality of island-shaped second conductors.

2. The semiconductor device according to claim 1,
wherein the semiconductor device is provided over a substrate, and
wherein the first wiring and the second wiring are meandered parallel to the substrate.

3. The semiconductor device according to claim 1, wherein a current mirror circuit is constituted by the first transistor and the second transistor.

4. The semiconductor device according to claim 1, wherein the second transistor includes a plurality of thin film transistors, which are electrically connected in parallel.

5. The semiconductor device according to claim 1, wherein the photoelectric conversion element is a stacked layer including a p-type semiconductor, an i-type semiconductor and an n-type semiconductor.

6. An electronic device comprising:
a display unit;
a driver circuit driving the display unit; and
a photo sensor unit electrically connected to the driver circuit, the photo sensor unit comprising:
a first terminal electrically connected to a first electric power source, the first terminal supplying a first electric potential;
a photoelectric conversion element electrically connected to the first terminal, the photoelectric conversion element outputting a first voltage;
a first transistor including a first gate electrode, a first drain electrode and a first source electrode, the first gate electrode and the first drain electrode being electrically connected to the photoelectric conversion element, the first transistor outputting a first current from the first source electrode by the first voltage applied to the first gate electrode;
a first wiring electrically connected to the first terminal in parallel to the photoelectric conversion element;
a second transistor including a second gate electrode, a second drain electrode and a second source electrode, the second gate electrode being electrically connected to the photoelectric conversion element, the second drain electrode being electrically connected to the first wiring, the second transistor outputting a second current from the second source electrode by the first voltage applied to the second gate electrode;
a second wiring electrically connected to a point where the first source electrode and the second source electrode are electrically connected to each other; and
a second terminal electrically connected to the second wiring, the second terminal supplying a second electric potential lower than the first electric potential,
wherein the first current and the second current flow in the second wiring,
wherein the first wiring and the second wiring are provided in a meandering shape,
wherein the first wiring includes a plurality of island-shaped first conductors and a plurality of island-shaped second conductors, and
wherein the plurality of island-shaped first conductors are electrically connected alternately by the plurality of island-shaped second conductors.

7. The electronic device according to claim 6,
wherein the electronic device is provided over a substrate, and
wherein the first wiring and the second wiring are meandered parallel to the substrate.

8. The electronic device according to claim 6, wherein a current mirror circuit is constituted by the first transistor and the second transistor.

9. The electronic device according to claim 6, wherein the second transistor includes a plurality of thin film transistors, which are electrically connected in parallel.

10. The electronic device according to claim 6, wherein the photoelectric conversion element is a stacked layer including a p-type semiconductor, an i-type semiconductor and an n-type semiconductor.

11. A semiconductor device comprising:
a first terminal electrically connected to a first electric power source, the first terminal supplying a first electric potential;
a photoelectric conversion element electrically connected to the first terminal, the photoelectric conversion element outputting a first voltage;
a first transistor including a first gate electrode, a first drain electrode and a first source electrode, the first gate electrode and the first drain electrode being electrically connected to the photoelectric conversion element, the first transistor outputting a first current from the first source electrode by the first voltage applied to the first gate electrode;
a first wiring electrically connected to the first terminal in parallel to the photoelectric conversion element;
a second transistor including a second gate electrode, a second drain electrode and a second source electrode, the second gate electrode being electrically connected to the photoelectric conversion element, the second drain electrode being electrically connected to the first wiring, the second transistor outputting a second current from the second source electrode by the first voltage applied to the second gate electrode;
a second wiring electrically connected to a point where the first source electrode and the second source electrode are electrically connected to each other; and
a second terminal electrically connected to the second wiring, the second terminal supplying a second electric potential lower than the first electric potential,
wherein the first current and the second current flow in the second wiring, and
wherein the first wiring and the second wiring are provided in a meandering shape.

12. The semiconductor device according to claim 11, wherein the first wiring and the second wiring are provided in a single layer.

13. The semiconductor device according to claim 11, wherein the semiconductor device is provided over a substrate, and
wherein the first wiring and the second wiring are meandered parallel to the substrate.

14. The semiconductor device according to claim 11, wherein each of the first wiring and the second wiring is provided in a first layer and a second layer with an insulating film therebetween.

15. The semiconductor device according to claim 11, wherein a current mirror circuit is constituted by the first transistor and the second transistor.

16. The semiconductor device according to claim 11, wherein the second transistor includes a plurality of thin film transistors, which are electrically connected in parallel.

17. The semiconductor device according to claim 11, wherein the photoelectric conversion element is a stacked layer including a p-type semiconductor, an i-type semiconductor and an n-type semiconductor.

* * * * *